(12) United States Patent
Dono et al.

(10) Patent No.: US 10,008,287 B2
(45) Date of Patent: Jun. 26, 2018

(54) SHARED ERROR DETECTION AND CORRECTION MEMORY

(71) Applicant: Micron Technology, Inc., Boise, ID (US)

(72) Inventors: Chiaki Dono, Chigasaki (JP); Taihei Shido, Sagamihara (JP); Yuki Ebihara, Chofu (JP)

(73) Assignee: Micron Technology, Inc., Boise, ID (US)

( * ) Notice: Subject to any disclaimer, the term of this patent is extended or adjusted under 35 U.S.C. 154(b) by 27 days.

(21) Appl. No.: 15/217,719

(22) Filed: Jul. 22, 2016

(65) Prior Publication Data

US 2018/0025789 A1    Jan. 25, 2018

(51) Int. Cl.
| | |
|---|---|
| *G11C 29/00* | (2006.01) |
| *G11C 29/38* | (2006.01) |
| *G11C 29/36* | (2006.01) |
| *G11C 29/44* | (2006.01) |

(52) U.S. Cl.
CPC .............. *G11C 29/38* (2013.01); *G11C 29/36* (2013.01); *G11C 29/44* (2013.01)

(58) Field of Classification Search
None
See application file for complete search history.

(56) References Cited

U.S. PATENT DOCUMENTS

| | | | | |
|---|---|---|---|---|
| 7,529,890 | B1 * | 5/2009 | Neuman | G06F 11/2236 711/130 |
| 2010/0257495 | A1 * | 10/2010 | Wu | H01L 23/544 716/111 |
| 2010/0332177 | A1 * | 12/2010 | Wu | G01R 31/318558 702/117 |
| 2011/0002154 | A1 * | 1/2011 | Mitani | G11C 13/0007 365/148 |
| 2011/0184688 | A1 * | 7/2011 | Uetake | G11C 29/40 702/120 |
| 2012/0124532 | A1 * | 5/2012 | Coteus | H01L 25/0657 716/104 |
| 2012/0138927 | A1 * | 6/2012 | Kang | G01R 31/318513 257/48 |
| 2012/0162836 | A1 * | 6/2012 | Furuta | H01L 23/62 361/56 |
| 2012/0213022 | A1 * | 8/2012 | Yang | G11C 29/48 365/201 |
| 2013/0049796 | A1 * | 2/2013 | Pang | G01R 31/318513 326/16 |

(Continued)

*Primary Examiner* — Daniel McMahon
(74) *Attorney, Agent, or Firm* — Dorsey & Whitney LLP

(57) ABSTRACT

Apparatuses and methods for an interface chip are described. An example apparatus includes a first chip. The first chip includes, on a single semiconductor substrate, first terminals, circuit groups, and terminal groups corresponding to the circuit groups, each of the circuit groups including circuit blocks. A control circuit in the first chip selects one of the circuit groups and electrically couples the first terminals to the circuit blocks of the selected circuit group. Second terminals are included in each of the terminal groups. A number of all of the second terminals in each of the terminal groups is smaller than a number of all of the circuit blocks in the corresponding circuit group. The first chip further includes, for example, a remapping circuit.

18 Claims, 17 Drawing Sheets

(56) References Cited

U.S. PATENT DOCUMENTS

2013/0153898 A1\* 6/2013 Takahashi ............... H01L 22/32
                                                                         257/48
2015/0235715 A1\* 8/2015 Cho ....................... G11C 29/12
                                                                        714/719

\* cited by examiner

| 19a | 19b | 19c | 19d | 19e | 19k | | 19f | 19g | 19h | 19i | 19j |
|---|---|---|---|---|---|---|---|---|---|---|---|
| DBI0 | DQ7 | DQ6 | DQ5 | DQ4 | RD0 | | DQ3 | DQ2 | DQ1 | DQ0 | DM0 |
| | | | | | WDQS_c | PAR | | | | | |
| DBI1 | DQ15 | DQ14 | DQ13 | DQ12 | | WDQS_t | DQ11 | DQ10 | DQ9 | DQ8 | DM1 |

FIG. 5A

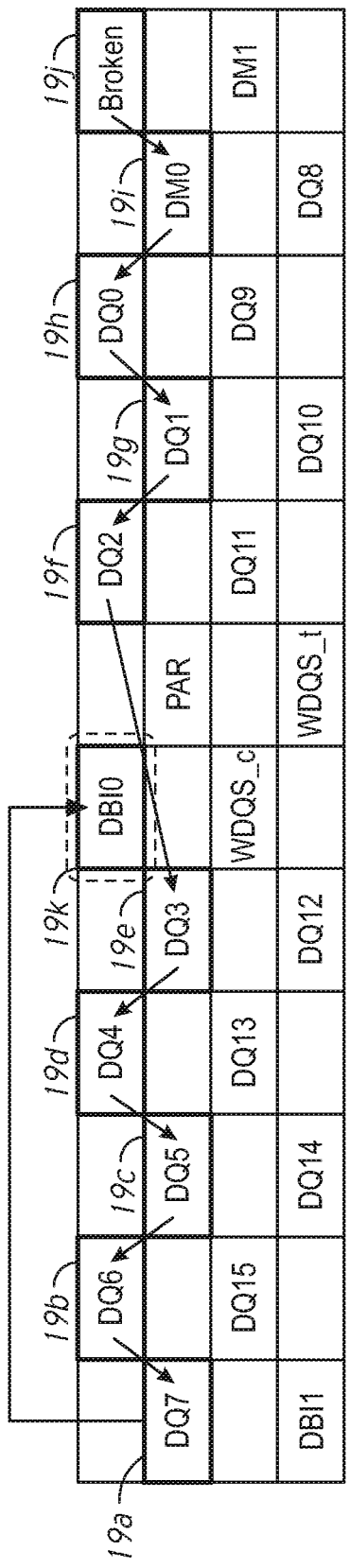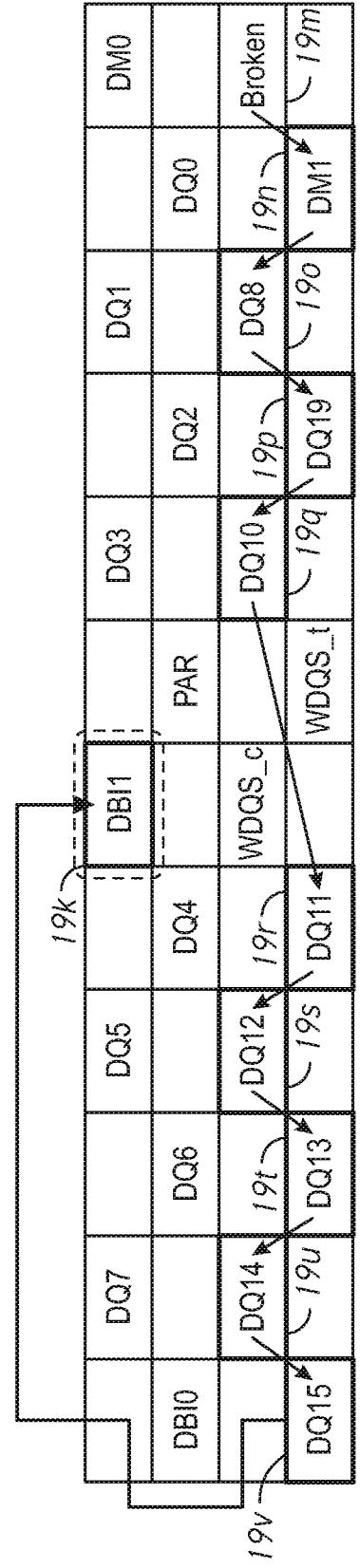
FIG. 5B
FIG. 5C

FIG. 6A

| Internal Function | DBI1 | DQ15 | DQ14 | DQ13 | DQ12 | DQ11 | DQ10 | DQ9 | DQ8 | DM1 | DBI0 | DQ7 | DQ6 | DQ5 | DQ4 | DQ3 | DQ2 | DQ1 | DQ0 | DM0 |
|---|---|---|---|---|---|---|---|---|---|---|---|---|---|---|---|---|---|---|---|---|
| Bump | DBI1 | DQ15 | DQ14 | DQ13 | DQ12 | DQ11 | DQ10 | DQ9 | DQ8 | DM1 | DBI0 | DQ7 | DQ6 | DQ5 | DQ4 | DQ3 | DQ2 | DQ1 | DQ0 | DM0 |
| Test Port | 9 | 8 | 7 | 6 | 5 | 4 | 3 | 2 | 1 | 0 | 9 | 8 | 7 | 6 | 5 | 4 | 3 | 2 | 1 | 0 |
| Circuit Block | 19v | 19u | 19t | 19s | 19r | 19q | 19p | 19o | 19n | 19m | 19a | 19b | 19c | 19d | 19e | 19f | 19g | 19h | 19i | 19j |

FIG. 6B

| Internal Function | DBI1 | DQ15 | DQ14 | DQ13 | DQ12 | DQ11 | DQ10 | DQ9 | DQ8 | DM1 | DBI0 | DQ7 | DQ6 | DQ5 | DQ4 | DQ3 | DQ2 | DQ1 | DQ0 | DM0 |
|---|---|---|---|---|---|---|---|---|---|---|---|---|---|---|---|---|---|---|---|---|
| Bump | DBI1 | DQ15 | DQ14 | DQ13 | DQ12 | DQ11 | DQ10 | DQ9 | DQ8 | DM1 | RDQ | DQ7 | DQ6 | DQ5 | DQ4 | DQ3 | DQ2 | DQ1 | DQ0 | DM0 |
| Test Port | 9 | 8 | 7 | 6 | 5 | 4 | 3 | 2 | 1 | 0 | 0 | 9 | 8 | 7 | 6 | 5 | 4 | 3 | 2 | 1 |
| Circuit Block | 19v | 19u | 19t | 19s | 19r | 19q | 19p | 19o | 19n | 19m | 19k | 19a | 19b | 19c | 19d | 19e | 19f | 19g | 19h | 19i |

FIG. 6C

| Internal Function | DBI1 | DQ15 | DQ14 | DQ13 | DQ12 | DQ11 | DQ10 | DQ9 | DQ8 | DM1 | DBI0 | DQ7 | DQ6 | DQ5 | DQ4 | DQ3 | DQ2 | DQ1 | DQ0 | DM0 |
|---|---|---|---|---|---|---|---|---|---|---|---|---|---|---|---|---|---|---|---|---|
| Bump | RDQ | DQ15 | DQ14 | DQ13 | DQ12 | DQ11 | DQ10 | DQ9 | DQ8 | DM1 | DBI0 | DQ7 | DQ6 | DQ5 | DQ4 | DQ3 | DQ2 | DQ1 | DQ0 | DM0 |
| Test Port | 0 | 9 | 8 | 7 | 6 | 5 | 4 | 3 | 2 | 1 | 9 | 8 | 7 | 6 | 5 | 4 | 3 | 2 | 1 | 0 |
| Circuit Block | 19k | 19v | 19u | 19t | 19s | 19r | 19q | 19p | 19o | 19n | 19a | 19b | 19c | 19d | 19e | 19f | 19g | 19h | 19i | 19j |

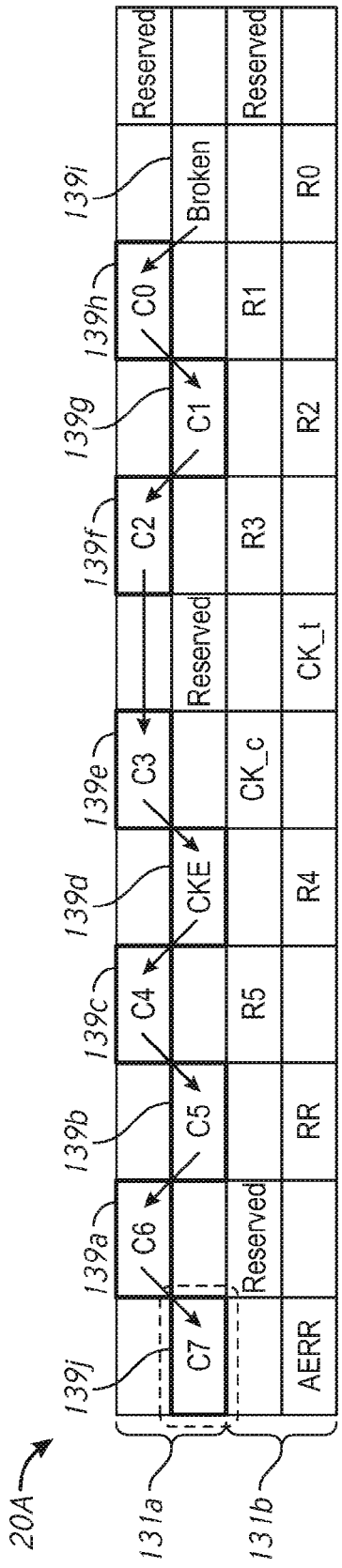
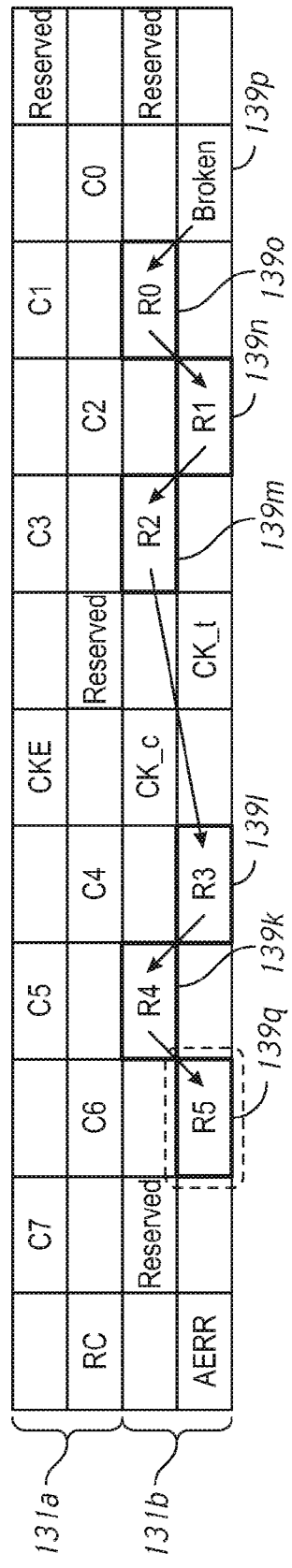
FIG. 13B
FIG. 13C

FIG. 14A

| Internal Function | C7 | C6 | C5 | C4 | CKE | C3 | C2 | C1 | C0 | R5 | R4 | R3 | R2 | R1 | R0 |
|---|---|---|---|---|---|---|---|---|---|---|---|---|---|---|---|
| Bump | C7 | C6 | C5 | C4 | CKE | C3 | C2 | C1 | C0 | R5 | R4 | R3 | R2 | R1 | R0 |
| Test Port | 24 | 23 | 22 | 21 | 20 | 19 | 18 | 17 | 16 | 15 | 14 | 13 | 12 | 11 | 10 |
| Circuit Block | 139a | 139b | 139c | 139d | 139e | 139f | 139g | 139h | 139i | 139k | 139L | 139m | 139n | 139o | 139p |

FIG. 14B

| Internal Function | C7 | C6 | C5 | C4 | CKE | C3 | C2 | C1 | C0 | R5 | R4 | R3 | R2 | R1 | R0 |
|---|---|---|---|---|---|---|---|---|---|---|---|---|---|---|---|
| Bump | RC | C7 | C6 | C5 | C4 | CKE | C3 | C2 | C1 | C0 | R5 | R4 | R3 | R2 | R1 | R0 |
| Test Port | 16 | 24 | 23 | 22 | 21 | 20 | 19 | 18 | 17 | 15 | 14 | 13 | 12 | 11 | 10 |
| Circuit Block | 139i | 139a | 139b | 139c | 139d | 139e | 139f | 139g | 139h | 139k | 139L | 139m | 139n | 139o | 139p |

FIG. 14C

| Internal Function | C7 | C6 | C5 | C4 | CKE | C3 | C2 | C1 | C0 | R5 | R4 | R3 | R2 | R1 | R0 |
|---|---|---|---|---|---|---|---|---|---|---|---|---|---|---|---|
| Bump | C7 | C6 | C5 | C4 | CKE | C3 | C2 | C1 | C0 | RR | R5 | R4 | R3 | R2 | R1 |
| Test Port | 24 | 23 | 22 | 21 | 20 | 19 | 18 | 17 | 16 | 10 | 15 | 14 | 13 | 12 | 11 |
| Circuit Block | 139a | 139b | 139c | 139d | 139e | 139f | 139g | 139h | 139i | 139g | 139k | 139L | 139m | 139n | 139o |

SHARED ERROR DETECTION AND CORRECTION MEMORY

BACKGROUND

High data reliability, high speed of memory access, lower power consumption and reduced chip size are features that are demanded from semiconductor memory. In recent years, three-dimensional (3D) memory devices have been introduced. Some 3D memory devices are formed by stacking chips vertically and interconnecting the chips using through substrate vias (TSVs) between an interface (I/F) die and core dies as shown in FIG. 1A. Benefits of the 3D memory devices include shorter interconnects which reduce circuit delays and power consumption, a large number of vertical vias between layers which allow wide bandwidth buses between functional blocks in different layers, and a considerably smaller footprint. Thus, the 3D memory devices contribute to higher memory access speed, lower power consumption and chip size reduction. Example 3D memory devices include Hybrid Memory Cube (HMC), High Bandwidth Memory (HBM), and a wide-I/O dynamic random access memory (DRAM).

FIG. 1B is a cross-sectional view of a structure of through silicon vias in the HBM in FIG. 1A. As shown in FIG. 1B, a through silicon via (TSV) 68 in an interface chip 6 is silicon substrate layers 63 and wiring layers 67. The through silicon via 68 and an internal circuit 66 across a transistor region 65 in the silicon substrate layers 63 and wiring layers 67 are insulated from each other. An end of the through silicon via 68 on a side of a core chip 7 of the silicon substrate layers 63 is covered by an interface terminal 69 (e.g., surface bump). The interface terminal 69 may be an electrode that contacts a core terminal 79 (e.g., surface bump) provided in a core chip 7. For example, the surface bump 69 is coupled to a plurality of pads 611 provided in the wiring layers 67 through the through silicon via 68. A through-hole electrode 612 may couple the plurality of pads 611 to each other in the wiring layers 67. Further, the plurality of pads 611 is coupled to the internal circuit 66 through internal wiring lines (not shown in the drawings).

For example, High Bandwidth Memory (HBM) is a type of memory including a high-performance DRAM interface and vertically stacked DRAM. A typical HBM stack of four DRAM core chips contains two channels per chip, and each of the two channels includes 128 bit I/Os. The typical HBM stack may contain a total of eight input/output channels and a width of 1024 bits in total. An interface (I/F) chip of the HBM provides an interface with the eight input/output channels, which function independently of each other. For example, a clock frequency, a command sequence, and data can be independently provided for each channel. Thus, the eight input/output channels are not necessarily synchronous to each other. The HBM may be provided as a silicon-in-package (SiP) including the above DRAM core chips and the I/F chip together with a memory controller interconnected via an interposer through microbumps on the I/F chip. In the typical HBM stack, there are more than 1700 microbumps. One error of the 1700 microbumps may results in a defective HBM. In order to improve the SiP assembly yield and recover functionality of the HBM stack, "Interconnect Redundancy Remapping" has been introduced in JEDEC Standard 235A. In Interconnect Redundancy Remapping, lane remapping may be performed for each channel independently, in a manner the SiP assembly may be programmed to retain the remapped lane information. In order to perform the lane remapping, a test interface uses the same number of test pads as the microbumps. However, implementing the test interface including the more than 1700 test pads microbumps may cause a larger layout size and an extra test time.

BRIEF DESCRIPTION OF THE DRAWINGS

FIG. 5A is a schematic diagram of an original lane assignment of the bump array units in FIG. 4, in accordance with an embodiment of the present disclosure.

FIG. 5B is a schematic diagram of a remapped lane assignment of the bump array units in FIG. 4, in accordance with an embodiment of the present disclosure.

FIG. 5C is a schematic diagram of a remapped lane assignment of the bump array units in FIG. 4, in accordance with an embodiment of the present disclosure.

FIG. 6A is a lane mapping table of the original lane assignment of FIG. 5A, in accordance with an embodiment of the present disclosure.

FIG. 6B is a lane mapping table of the remapped lane assignment of FIG. 5B, in accordance with an embodiment of the present disclosure.

FIG. 6C is a lane mapping table of the remapped lane assignment of FIG. 5C, in accordance with an embodiment of the present disclosure.

FIG. 13B is a schematic diagram of a remapped lane assignment for column address signals in a circuit group for an address word, in accordance with an embodiment of the present disclosure.

FIG. 13C is a schematic diagram of a remapped lane assignment for row address signals in a circuit group for an address word, in accordance with an embodiment of the present disclosure.

FIG. 14A is a lane mapping table of the original lane assignment of FIG. 13A, in accordance with an embodiment of the present disclosure.

FIG. 14B is a lane mapping table of the remapped lane assignment of FIG. 13B, in accordance with an embodiment of the present disclosure.

FIG. 14C is a lane mapping table of the remapped lane assignment of FIG. 13C, in accordance with an embodiment of the present disclosure.

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1A:
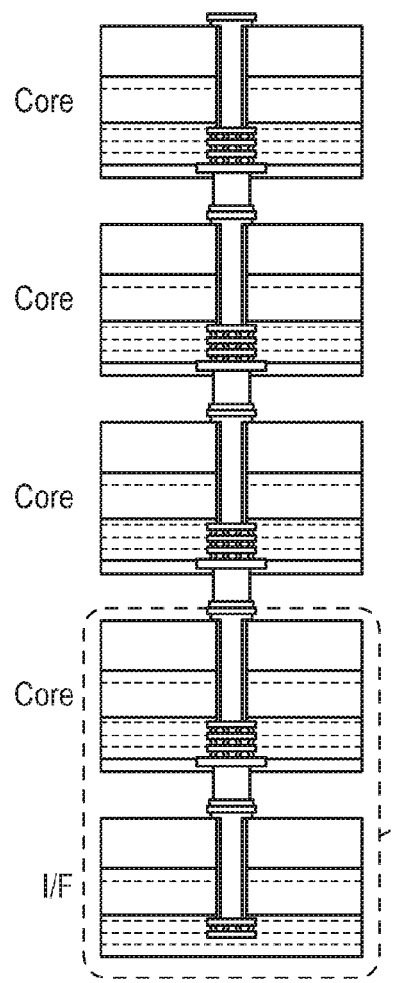
FIG. 1A is a schematic diagram of an interface (I/F) die and a plurality of core dies of HBM in a semiconductor device.
Figure 1B:
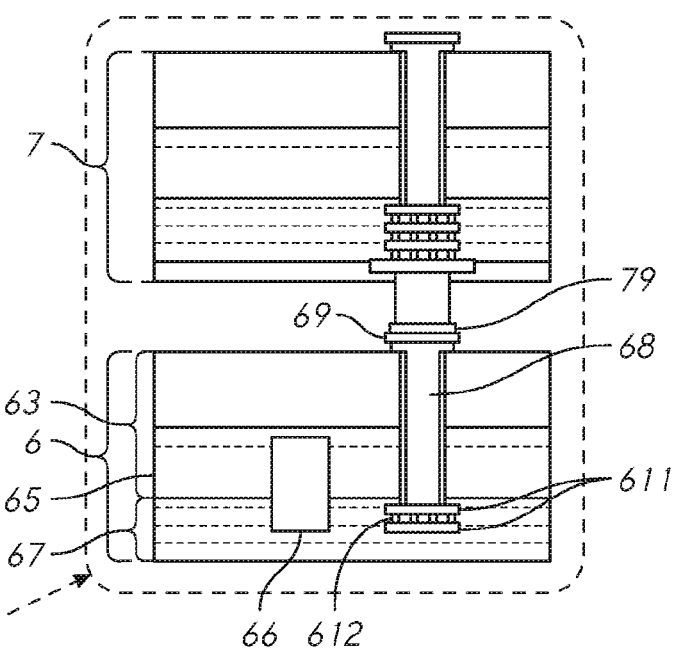
FIG. 1B is a cross-sectional view of a structure of through silicon vias in the HBM in FIG. 1A.
Figure 1C:
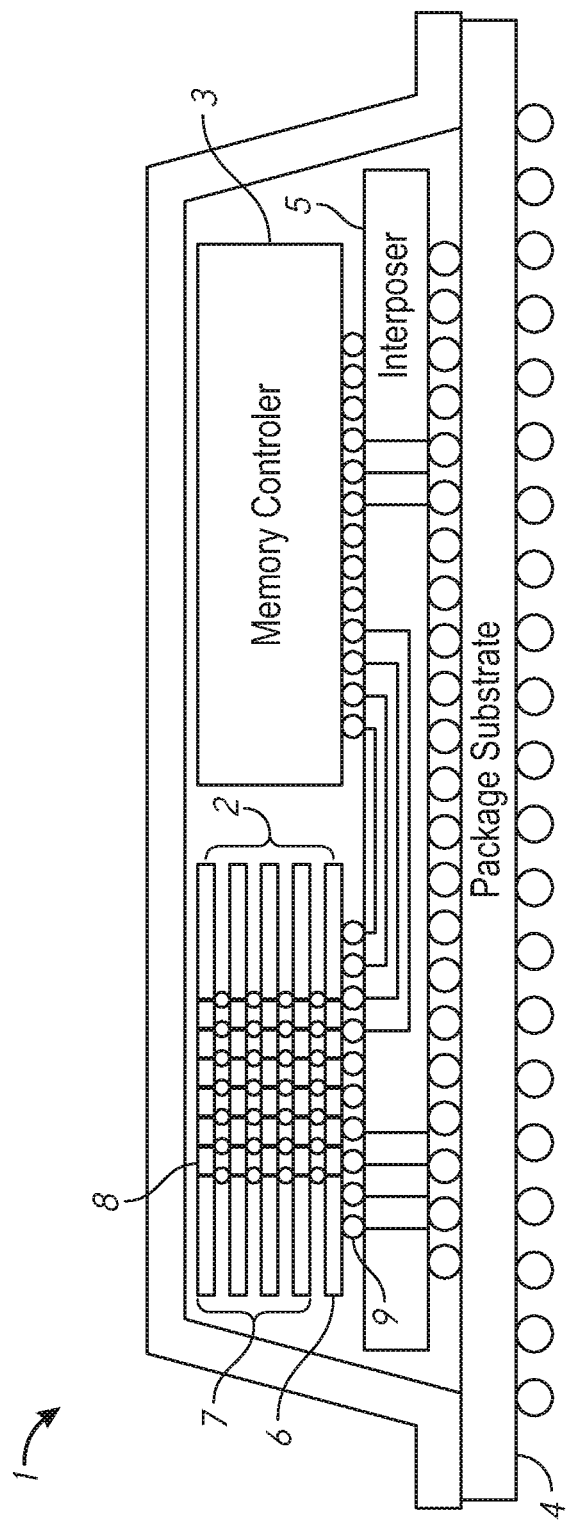
FIG. 1C is a schematic diagram of a semiconductor device including an interface (I/F) chip and a plurality of core chips in accordance with an embodiment of the present disclosure.

FIG. 1C is a schematic diagram of a semiconductor device including an interface (I/F) logic chip and a plurality of core chips in accordance with an embodiment of the present disclosure. For example, the semiconductor device 1 may include a three-dimensional (3D) memory device 2 and a memory controller 3, which may be a controller chip, on an interposer 5 on a package substrate 4. The interposer 5 may interconnect the memory controller 3 and the memory device 2. For example, the 3D memory device 2 may be an HBM, an HMC, a Wide-IO DRAM, etc. The 3D memory device 2 may include an I/F chip 6 and core chips 7 stacked with each other. In this example, each core chip 7 may be a memory chip that may include a plurality of channels. The memory chip may be DRAM. Each channel may include a plurality of memory cells and circuitries accessing the memory cells. For example, the memory cells may be DRAM memory cells. The 3D memory device 2 may include conductive vias TSVs 8 (e.g., through substrate electrodes) which couple the I/F chip 6 and core chips 7 by penetrating the I/F chip 6 and core chips 7. The I/F chip 6 may be coupled to the interposer 5 via interconnects, such as bumps 9. For example, the bumps 9 may be microbumps having bump pitches of less than about or less than one hundred micro meters and exposed on an outside of the I/F chip 6.

Figure 2:
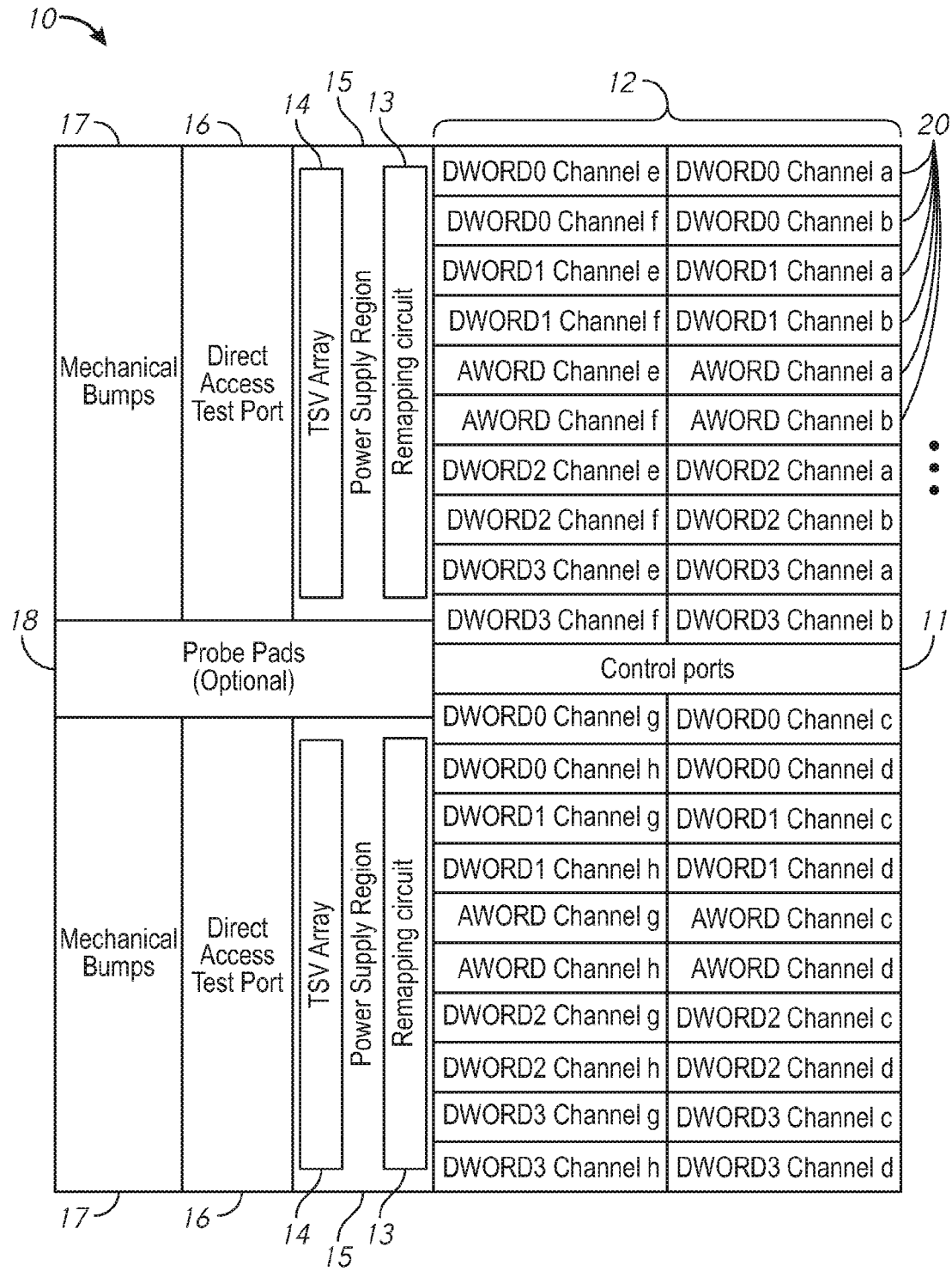
FIG. 2 is a schematic diagram of the I/F chip including a layout of a bump region, in accordance with an embodiment of the present disclosure.

FIG. 2 is a schematic diagram of the I/F chip 6 including a layout of a bump region, in accordance with an embodiment of the present disclosure. For example, a bump region 10 may include a word bump array region 12 including a plurality of circuit groups 20 for providing signals. The bump region 10 may also include control ports 11 for providing corresponding control signals. The control ports 11 may include a reset port, an IEEE 1500 interface for testing embedded core chips. For example, the three-dimensional memory device 2 may have eight-channel configuration of four core chips 7 stacked to each other. Each core chip 7 may include two channels. The eight channels may be represented as channel a, channel b, . . . to channel h, where each channel has a group of signal paths independently from the other channels. For example, one core chip may include channels a and b, one other core chip may include channels c and d, one other core chip may include channel e and f, and one other core chip may include channels g and h. The plurality of circuit groups 20 for communications with the core chips 7. A portion of the plurality of circuit groups 20D for data words in the word bump array region 12 may receive or transmit data I/O related signals (e.g., data queue DQ, data queue strobe DQS, data mask DM) which may be represented as "DWORD". An other portion of the plurality of circuit groups 20A for address words in a word bump array region 12 may receive command and address signals that may be represented as "AWORD". For each channel, corresponding bumps 9 may be provided for four DWORD circuit groups 20D and one AWORD circuit group 20A. For example, a direct access test port region 16 may receive test signals from the memory controller or bonding pads exposed on an outside of the I/F chip 6, in test operations. A power supply region 15 may be a power supply related region. The power supply region 15 may include a remapping circuit 13 and a conductive via (TSV) array sub region 14. The TSV array sub region 14 may include the plurality of TSVs 8. Each TSV 8 may couple a corresponding bump 9 to a corresponding core chip 7 in a point to point manner. For example, the TSVs 8 may be spiral TSVs. The remapping circuit 13 may include circuits which may perform a "lane remapping" function. A mechanical bump region 17 may be coupled to a portion of the bumps 9 which may be arranged due to mechanical reasons. There may be an optional probe pad region 18 which may be coupled to a portion of bumps for coupling to probe pads.

Figure 3:
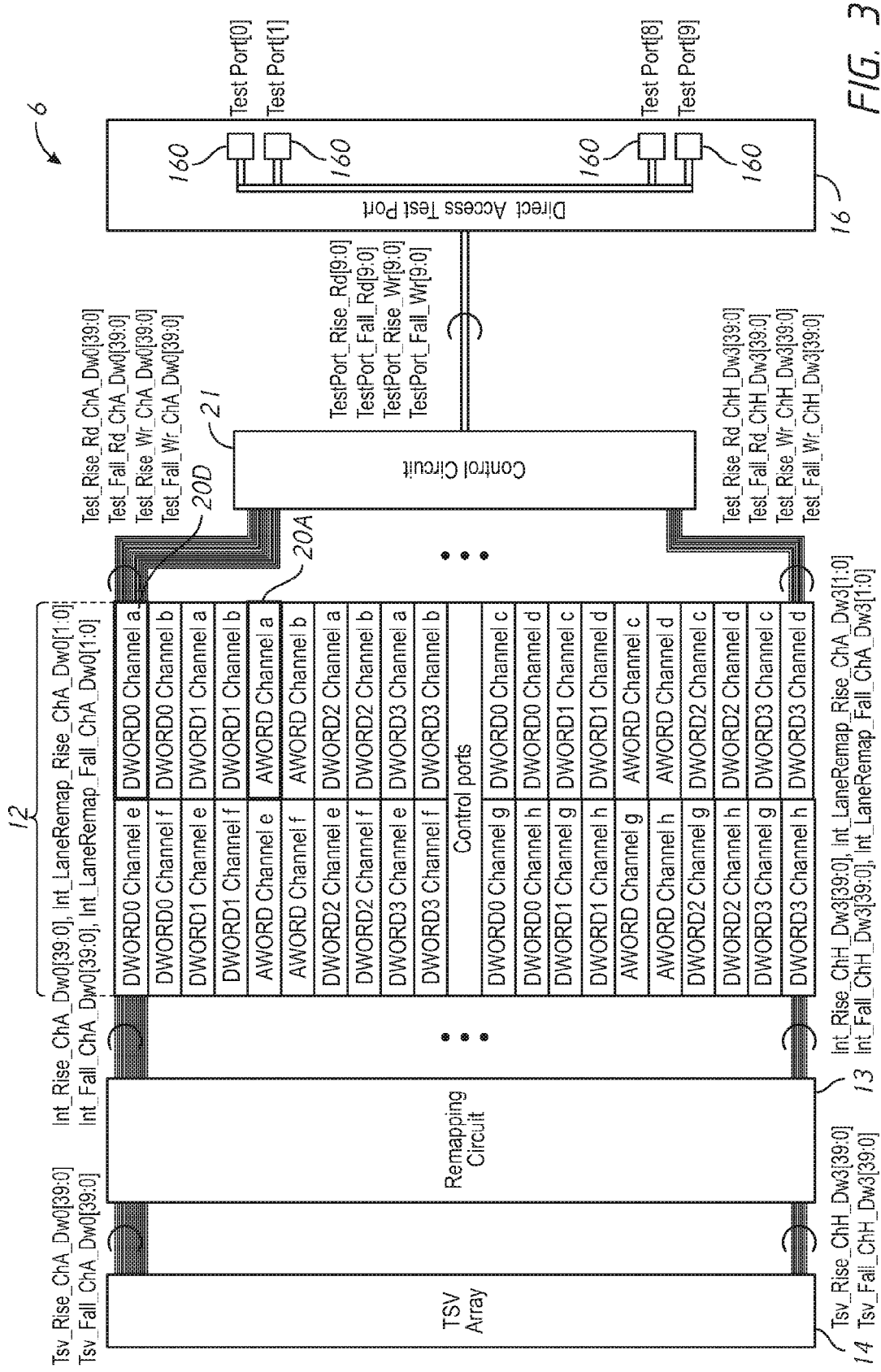
FIG. 3 is a block diagram of a portion of the I/F chip and a test circuit in accordance with an embodiment of the present disclosure.

FIG. 3 is a block diagram of a portion of the I/F chip in accordance with an embodiment of the present disclosure. FIG. 3 includes circuits relevant to DWORD test operations. For example, FIG. 3 includes test pads, signal lines, test control blocks and test control signals for DWORD circuit groups. The direct access test port region 16 may include a group of terminals. For example, the group of terminals may be a set of ten test ports 160 (e.g., Test Port[0] to Test Port[9]). Each test port 160 may couple a bump 9 for direct access or a test pad. For example, a set of four types of test signals such as rise/read signals (e.g., TestPort_Rise_Rd[9:0]), fall/read signals (e.g., TestPort_Fall_Rd[9:0]), rise/write signals (e.g., TestPort_Rise_Wr[9:0]) and fall/write signals (e.g., TestPort_Fall_Wr[9:0]) may be provided to a control circuit 21. For example, the control circuit 21 may include one or more test logics and one or more comparators. For example, the control circuit 21 may be controlled by the memory controller 3 to provide the test control signals in order to control each circuit group of the circuit groups. The control circuit 21 may use the set of four types of test signals for testing one DWORD bump array unit per word, represented as "DWORDx Channel y" of the word bump array region 12 where x may be either 0, 1, 2 or 3 and y may be one of the eight channels, (e.g., channel a to channel h). For example, "DWORD0 Channel a" may be one of DWORD circuit groups 20D per DWORD0 of channel a, which may be represented as a reference number "20Da0". For example, when one word includes four bytes and ten circuit blocks may be tested for each byte, each one DWORD circuit group 20D may include four sets of ten circuit blocks corresponding to the four bytes. Each set of circuit block may be configured to electrically connect to the set of test ports. The control circuit 21 may couple a portion of the set of circuit blocks to the set of test ports. The forty sets of four types of test signals may include rise/read signals (e.g., Test_Rise_Rd_Chy_Dwx[39:0]), fall/read signals (e.g., Test_Fall_Rd_Chy_Dwx[39:0]), rise/write signals (e.g., Test_Rise_Wr_Chy_Dwx[39:0]) and fall/write signals (e.g., Test_Fall_Wr_Chy_Dwx[39:0]) to each DWORD circuit group 20D where "x" may be either 0, 1, 2 or 3 and "y" may be one of the eight channels, (e.g., channel a to channel h). Each circuit block may be coupled to a corresponding test port which will be described later referring to FIGS. 9 and 10. The control circuit 21 may select one of the circuit groups and electrically connect the set of test ports to a set of circuit blocks of the selected one of the circuit group. For example, FIG. 3 the control circuit 21 may provide forty test signals from the set of ten test ports 160 to ten corresponding circuit blocks in one DWORD circuit group 20D for one test operation. FIG. 3 does not show test pads, signal lines and test control signals for AWORD circuit groups 20A which may be included, other than an example "AWORD Channel y", such as "AWORD Channel a" 20A. Each "AWORD" circuit group 20A may have a similar lane remapping configuration and test signals as each "DWORD" circuit group 20D.

Figure 4:
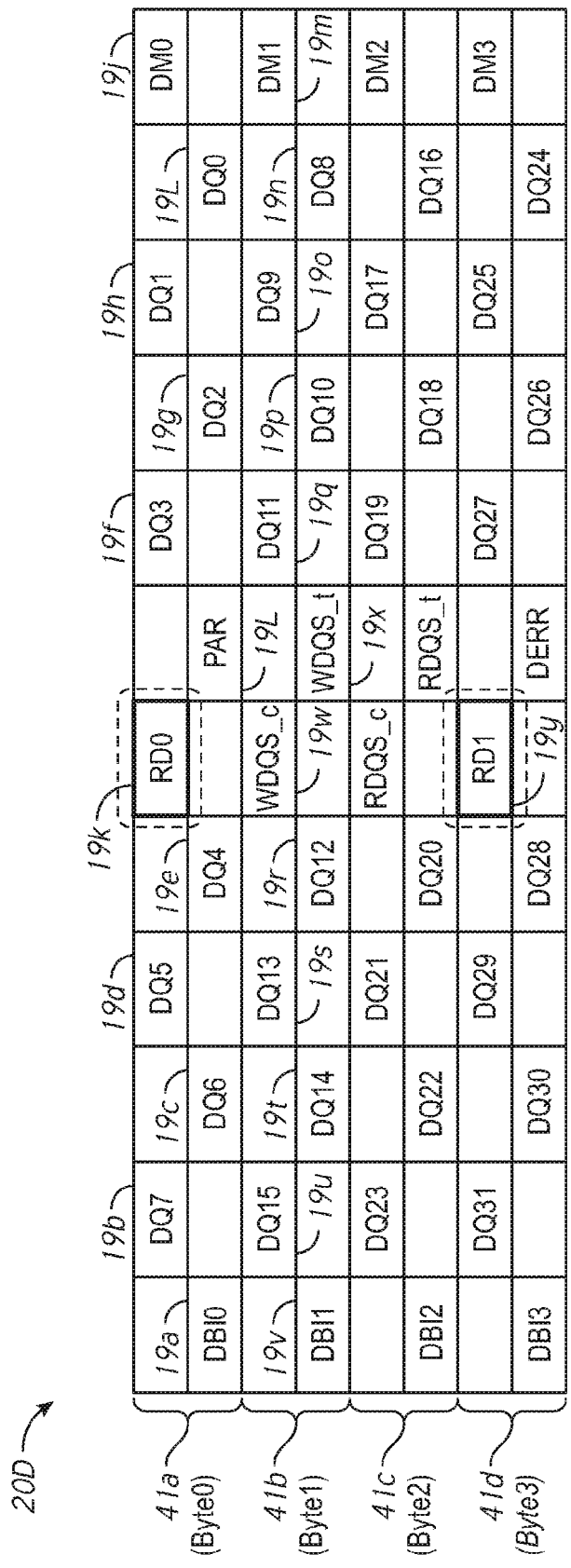
FIG. 4 is a schematic diagram of a bump assignment in a circuit group for a data word, in accordance with an embodiment of the present disclosure.

FIG. 4 is a schematic diagram of a bump assignment in a circuit group for a data word, in accordance with an embodiment of the present disclosure. For example, the circuit group may be a DWORD circuit group 20D including four bump array units for corresponding four bytes per word, such as a bump array unit 41a for Byte0, a bump array unit 41b for Byte1, a bump array unit 41c for Byte2 and a bump array unit 41d for Byte3. For example, FIG. 4 shows assignments of corresponding bumps 9 to the set of bump array units per one word that may be the DWORD circuit group 20D. Each bump array unit of the bump array units 41a to 41d may include a plurality of circuit blocks 19, including circuit blocks 19 to be coupled to corresponding bumps 9 in one test operation for testing the DWORD circuit group 20D. Here, the number of the test ports (e.g., ten) to be coupled to the circuit blocks 19 may be smaller than the number of the plurality of circuit blocks 19 (e.g., twelve in the bump array unit 41a). For example, the bump array unit 41a for Byte0 may include circuit blocks 19a, 19b, 19c, 19d, 19e, 19f, 19g, 19h, 19i, and 19j which may correspond to bumps 9 for providing signals from pins DBI0, DQ7, DQ6, DQ5, DQ4, DQ3, DQ2, DQ1, DQ0 and DM0. The circuit blocks 19k and 19l corresponds to a redundancy lane RD0 and a parity signal PAR provided for each DWORD. The bump array unit 41b for Byte1 may include circuit blocks 19m, 19n, 19o, 19p, 19q, 19r, 19s, 19t, 19u and 19v which may correspond to bumps 9 for providing signals from pins DM1, DQ8, DQ9, DQ10, DQ11, DQ12, DQ13, DQ14, DQ15, DQ16 and DBI1. The circuit blocks 19w and 19x correspond to bumps for write data queue strobe signals WDQS_c and WDQS_t. The bump array unit 41c for Byte2 may include circuit blocks 19 corresponding to bumps 9 for providing signals from pins DM2, DQ16 to DQ23, DBI2, read data queue strobe signals RDQS_c and RDQS_t. The bump array unit 41d for Byte3 may include circuit blocks 19 corresponding to bumps 9 for providing signals from pins DM3, DQ24 to DQ31, DBI3, RD1 and DERR. For example, the pins DQ0 to DQ31 may receive data queue signals DQ0 to DQ31 per channel. There are some pins provided for functionalities of 3D memory devices, such as Data Mask (DM) function for write operations and Data Bus Inversion (DBI) function for read operations. The pins DBI0, DBI1, DBI2 and DBI3 may be bi-directional DDR pins per channel for data inversion signals DBI0, DBI1, DBI2 and DBI3, may be sampled along with eight data queue signals, DQ0 to DQ7, DQ8 to DQ15, DQ16 to DQ23, and DQ24 to DQ31, respectively. The pins DM0, DM1, DM2 and DM3 are for data mask signals provided for Byte0, Byte1, Byte2 and Byte3 per channel for data masking. The pin DERR is provided for each DWORD for providing an error signal after parity check with the parity signal PAR.

For example, one redundancy lane may be provided per two bytes. In this example, a redundancy lane RD0 at the circuit block 19k may be provided for Byte0 and Byte1, and a redundancy lane RD1 at the circuit block 19y may be provided for Byte2 and Byte3. The lane remapping function for the DWORD circuit group 20D may use circuit blocks 19 related to the data queue (DQ) signals DQ0 to DQ31, the data inversion signals DBI0 to DBI3, and the data mask signals DM0 to DM3.

FIG. 5A is a schematic diagram of an original lane assignment of the bump array units 41a and 41b in FIG. 4, in accordance with an embodiment of the present disclosure. FIG. 6A is a lane mapping table of the original lane assignment, in accordance with an embodiment of the present disclosure. For example, the lane mapping table shows a relationship between internal functions, bumps, test ports and circuit blocks for the DWORD circuit group 20D in FIG. 4. In the original lane assignment without lane remapping, circuit blocks 19a to 19j indicated by bold squares may be used for the data inversion signal DBI0, the data queue signals DQ7 to DQ0 and the data mask signal DM0. A circuit block 19k may be provided for a redundancy lane RD0.

FIG. 5B is a schematic diagram of a remapped lane assignment of the bump array units 41a and 41b in FIG. 4, in accordance with an embodiment of the present disclosure. FIG. 6B is a lane mapping table of the remapped lane assignment of FIG. 5B, in accordance with an embodiment of the present disclosure. For example, the lane mapping table shows a relationship between internal functions, bumps, test ports and circuit blocks for the DWORD circuit group 20D in FIG. 4. For example, a bump 9 corresponding to a circuit block 19j may be assigned as a broken lane for testing possible lane remapping variations. For example, the circuit blocks 19a to 19i in the remapped lane assignment indicated by bold squares in FIG. 5B may be used for the data queue signals DQ7 to DQ0 and the data mask signal DM0, after lane remapping. The circuit block 19k provided for the bump 9 for the redundancy lane RD0 in FIG. 5A may be used for the data inversion signal DBI0 in FIG. 5B.

Figure 7:
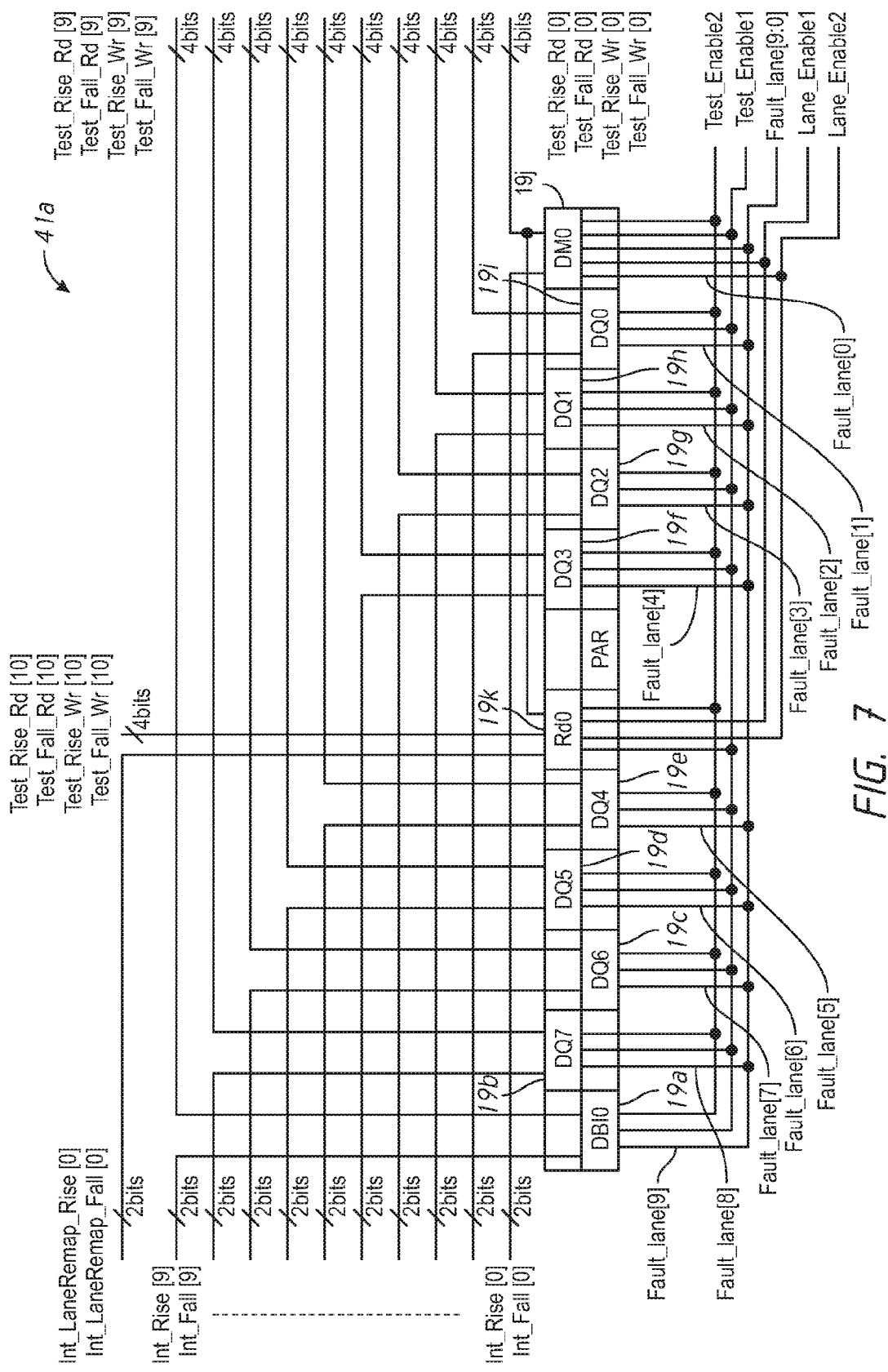
FIG. 7 is a schematic diagram of signal interconnections around a portion of the circuit blocks in the bump array unit of the remapped lane assignment of FIG. 5B, in accordance with an embodiment of the present disclosure.

FIG. 7 is a schematic diagram of signal interconnections around a portion of the circuit blocks 19 in the bump array unit 41a of the remapped lane assignment of FIG. 5B, in accordance with an embodiment of the present disclosure. The direct access test port region 16 in FIG. 3 may provide a plurality of sets of four types of test signals, such as rise/read signals (e.g., Test_Rise_Rd[9:0]), fall/read signals (e.g., Test_Fall_Rd [9:0]), rise/write signals (e.g., Test_Rise_Wr [9:0]) and fall/write signals (e.g., Test_Fall_Wr [9:0]) to the circuit blocks 19a to 19k of the bump array unit 41a. The control circuit 21 may provide control signals such as test enable signals Test_Enable1 and Test_Enable2, fault lane signals Fault_lane[9:0] and lane enable signals Lane_Enable1 and Lane_Enable2, for example, from respective test pads of the test ports [9:0] 160 arranged in the direct access test port region 16 in FIG. 3. Each bit of the Fault_lane[9:0] are provided to corresponding circuit blocks 19a to 19j. The lane enable signals Lane_Enable1 and Lane_Enable2 are provided to the circuit block 19k.

In this example, the bump array unit 41a for an even byte (e.g., Byte0) of the DWORD circuit group 20D, including the circuit blocks 19a to 19j in the bump array unit 41a may use the circuit block 19k coupled to a bump as a redundancy lane, as the Lane_Enable1 signal is activated. For example, a broken lane may be assigned to a bump 9 coupled to the circuit block 19j, as shown in FIG. 5B, for testing all possible lane remapping variations. For example, the circuit blocks 19a to 19i and the circuit block 19k in the remapped lane assignment indicated by bold squares may be used after lane remapping. In one embodiment, one set of the ten sets of test signals (e.g., Test_Rise_Rd[0], Test_Fall_Rd[0], Test_Rise_Wr[0], and Test_Fall_Wr[0]) may be commonly provided to the circuit block 19j in FIG. 5B and the circuit block 19k corresponding to the redundancy lane RD0 in FIG. 5A. Once each circuit block 19 of the circuit blocks 19a to 19j receives a read signal and a write signal for each of fall and rise provided through the word bump array region 12, each circuit block of the circuit blocks 19a to 19j may combine the read signal and the write signal into one signal. For example, the read signal Test_Rise_Rd[0] and Test_Rise_Wr[0] may be combined into one internal rise signal Int_Rise[0]. Similarly, the Test_Fall_Rd[0] and Test_Fall_Wr[0] may be combined into one internal fall signal Int_Fall[0]. As described the above, the circuit blocks 19a to 19j may provide Int_Rise[9:0] and Int_Fall[9:0], respectively. The circuit block 19k may receive a read signal and a write signal for fall and rise provided through the word bump array region 12 from two test ports, Test Port[0] and Test Port [10]. The signals from the Test Port [10] (e.g., Test_Rise_Rd[10], Test_Fall_Rd[10], Test_Rise_Wr[10], and Test_Fall_Wr[10]) may be provided from the bump array unit 41b. Depending on the lane enable signals, the control block 19k may combine the read signal and the write signal into one signal. The combined signals may be either from either Test Port [0] or Test Port [10]. Thus, the circuit block 19k may provide the combined signals as lane remapped signals "Int_LandRemap_Rise[0]" and "Int_LandRemap_Rise[0]" coupled to the redundancy lane RD0.

FIG. 5C is a schematic diagram of a remapped lane assignment of the bump array units 41a and 41b in FIG. 4, in accordance with an embodiment of the present disclosure. FIG. 6C is a lane mapping table of the remapped lane assignment of FIG. 5C, in accordance with an embodiment of the present disclosure. For example, the lane mapping table shows a relationship between internal functions, bumps, test ports and circuit blocks for the DWORD circuit group 20D in FIG. 4. For example, a bump 9 corresponding to a circuit block 19m may be assigned as a broken lane for testing possible lane remapping variations. For example, the circuit blocks 19v to 19n in the remapped lane assignment indicated by bold squares in FIG. 5C may be used for the data queue signals DQ15 to DQ8 and the data mask signal DM1, after lane remapping. The circuit block 19k provided for the bump 9 for the redundancy lane RDa0 in FIG. 5A may be used for the data inversion signal DBIa1 in FIG. 5c.

Figure 8:
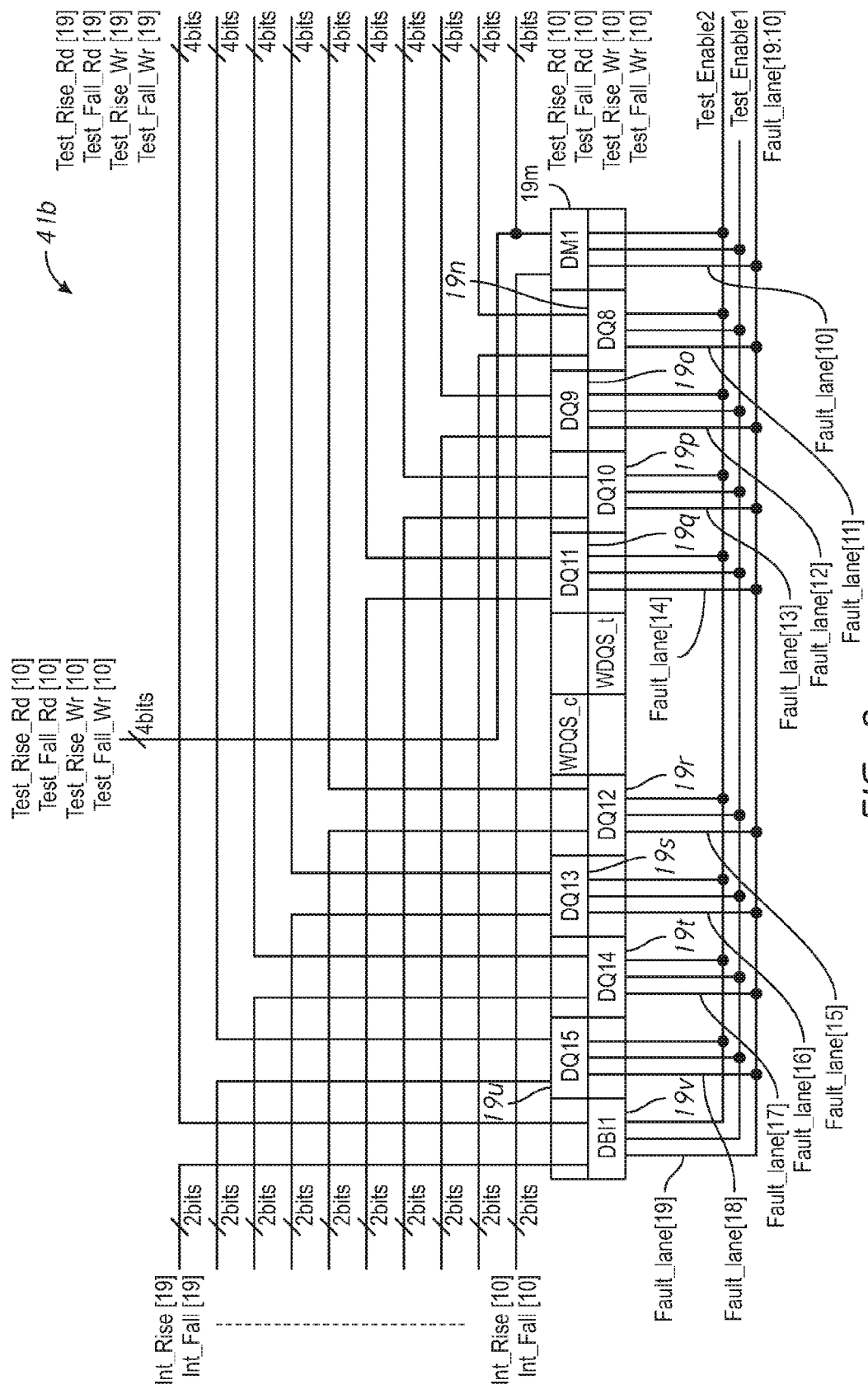
FIG. 8 is a schematic diagram of signal interconnections around a portion of the circuit blocks in the bump array unit of the remapped lane assignment of FIG. 5C, in accordance with an embodiment of the present disclosure.

FIG. 8 is a schematic diagram of signal interconnections around a portion of the circuit blocks 19 in the bump array unit 41b of the remapped lane assignment of FIG. 5C, in accordance with an embodiment of the present disclosure. The direct access test port region 16 in FIG. 3 may provide a plurality of sets of four types of test signals, such as rise/read signals (e.g., Test_Rise_Rd[19:10]), fall/read signals (e.g., Test_Fall_Rd[19:10]), rise/write signals (e.g., Test_Rise_Wr[19:10]) and fall/write signals (e.g., Test_Fall_Wr[19:10]) to the circuit blocks 19a to 19k of the bump array unit 41a. Similarly, the direct access test port region 16 in FIG. 3 may provide the control signals, such as the test enable signals Test_Enable1 and Test_Enable2 and the fault lane signals Fault_lane[19:10], for example. The control signals may be provided from respective test pads of the test ports [19:10] 160 arranged in the direct access test port region 16 in FIG. 3. Each bit of the Fault_lane[19:10] are provided to corresponding circuit blocks 19v to 19m.

In this example, the bump array unit 41b for an odd byte (e.g., Byte1) of the DWORD circuit group 20D, including the circuit blocks 19m to 19v may use the circuit block 19k coupled to the bump 9 as the redundancy lane, as the Lane_Enable2 signal is activated. For example, a broken lane may be assigned to a bump 9 coupled to the circuit block 19m, as shown in FIG. 5C, for testing all possible lane remapping variations. For example, the circuit blocks 19n to 19v and the circuit block 19k in the remapped lane assignment indicated by bold squares may be used after lane remapping. In one embodiment, one set of the ten sets of test signals (e.g., Test_Rise_Rd[10], Test_Fall_Rd[10], Test_Rise_Wr[10], and Test_Fall_Wr[10]) may be commonly provided to the circuit block 19m in FIG. 5C and the circuit block 19k in FIG. 7 corresponding to the redundancy lane RDa0 in FIG. 5A. Once each circuit block 19 of the circuit blocks 19m to 19v receives a read signal and a write signal for each of fall and rise provided through the word bump array region 12, each circuit block of the circuit blocks 19m to 19v may combine the read signal and the write signal into one signal. For example, the read signal Test_Rise_Rd[10] and Test_Rise_Wr[10] may be combined into one internal rise signal Int_Rise[10]. Similarly, the Test_Fall_Rd[10] and Test_Fall_Wr[10] may be combined into one internal fall signal Int_Fall[10]. As described the above, the circuit block 19m to 19v may provide Int_Rise[10:19] and Int_Fall[10:19], respectively. As previously described, the circuit block 19k may receive a read signal and a write signal for fall and rise provided through the word bump array region 12 from two test ports, Test Port[0] and Test Port[10]. The signals from the Test Port[10] (e.g., Test_Rise_Rd[10], Test_Fall_Rd[10], Test_Rise_Wr[10], and Test_Fall_Wr[10]) may be provided to the bump array unit 41a. Depending on the lane enable signals in FIG. 7, the control block 19k may combine the read signal and the write signal into one signal. The combined signals may be either from either Test Port[0] or Test Port[10]. Thus, the circuit block 19k may provide the combined signals as lane remapped signals "Int_LandRemap_Rise[0]" and "Int_LandRemap_Fall[0]" coupled to the redundancy lane RDa0.

Figure 9:
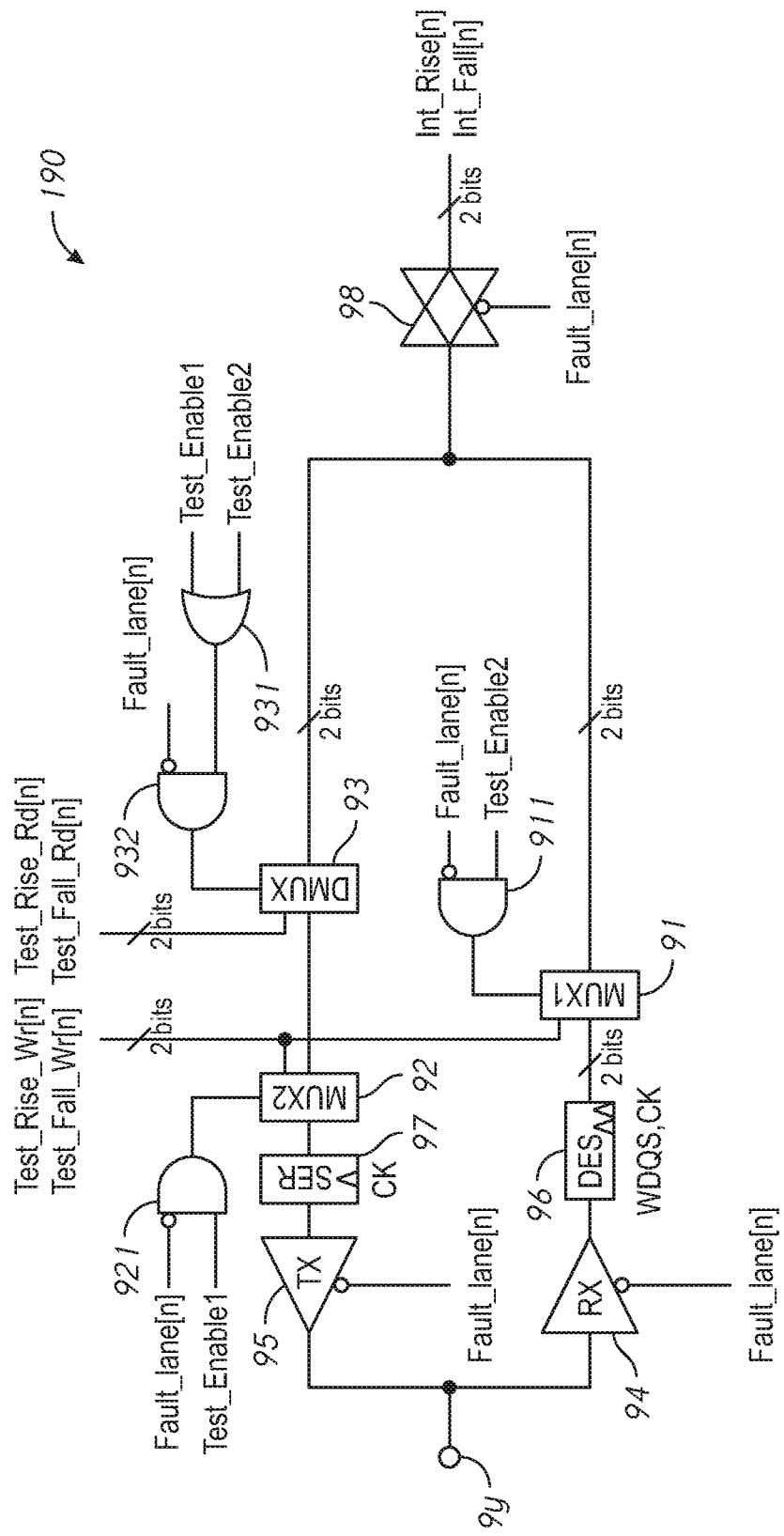
FIG. 9 is a circuit diagram of a circuit block, in accordance with an embodiment of the present disclosure.

FIG. 9 is a circuit diagram of a circuit block 190, in accordance with an embodiment of the present disclosure. For example, the circuit block 190 may be used as circuit blocks 19a to 19j and 19m to 19v, for bumps 9 to be coupled to DQ pins, DM pins and DBI pins as well as signals from one of the test ports 160 (e.g., Test Port[n], where "n" is a natural number which may take a number 0 to 10). In this circuit, two sets of two test signals may be combined into two test signals. For example, the circuit block 190 combines Test_Rise_Wr[n] signal and Test_Rise_Rd[n] signal into Int_Rise[n] signal. For example, the circuit block 190 combines Test_Fall_Wr[n] signal and Test_Fall_Rd[n] signal into Int_Fall[n] signal. Test_Enable1 signal may be active (e.g., a logic high level) when a test regarding a read operation is executed. Test_Enable2 signal may be active when a test regarding a write operation is executed. Fault_lane[n] signal may be active when the circuit block 19 coupled to Test Port[n] 160 may be tested as a broken lane.

The input buffer RX 94 and the output buffer TX 95 may be activated responsive to an inactive signal of Fault_lane[n]. The circuit block 190 may be coupled to a bump 9y.

For example, in the test regarding the write operation, the circuit block 190 may receive an input signal from the bump 9y at an input buffer RX 94. The circuit block 190 may include a deserializer 96 that converts the data signal received at the input buffer RX 94 into parallel data signals responsive to a clock signal CK and a write data queue strobe signal and provides the parallel data signals to a multiplexer MUX1 91. The MUX1 91 also receives the Test_Rise_Wr[n] signal and the Test_Fall_Wr[n] signal. A select input of the MUX1 91 receives an output signal of an AND circuit 911 which receives the Test_Enable2 signal and an inverted signal of the Fault_lane[n] signal. When the Fault_lane[n] signal is inactive, indicating that the lane is not tested as the broken lane, and the Test_Enable2 signal is active, indicating that the test for write operation is being executed, the MUX1 91 provides the Test_Rise_Wr[n] signal and the Test_Fall_Wr[n] signal. On the other hand, the MUX1 91 provides the parallel data signals when either the Fault_lane[n] signal is active or the Test_Enable2 signal is inactive. The MUX1 91 provides either the parallel data signals or a combination of the Test_Rise_Wr[n] signal and the Test_Fall_Wr[n] signal to a transmission gate 98. The transmission gate 98 may be a bi-directional switch, which provides and receives the internal signals Int_Rise[n] and Int_Fall[n], responsive to the inverted signal of Fault_lane[n].

A select input of a demultiplexer DMUX 93 receives an output signal of an AND circuit 932 which receives an inverted signal of the Fault_lane[n] signal and an output signal of an OR circuit 931 which receives Test_Enable1 and Test_Enable2 signals. The DMUX 93 provides input signals, either provided from the transmission gate 98 or provided from the MUX1 91 as output signals. When the Fault_lane[n] signal is inactive and either the Test_Enable1 signal or the Test_Enable2 signal is active, the DMUX 93 may provide the output signals as the Test_Rise_Rd[n] signal and the Test_Fall_Rd[n] signal. The DMUX 93 may provide the output signals as input signals to a multiplexer MUX2 92, when the Fault_lane[n] signal is active or neither the Test_Enable1 signal nor the Test_Enable2 signal is active.

The MUX2 92 also receives the Test_Rise_Wr[n] signal and the Test_Fall_Wr[n] signal. A select input gate of the MUX2 92 receives an output signal of an AND circuit 921 which receives the Test_Enable1 signal and the inverted signal of the Fault_lane[n] signal. When the Fault_lane[n] signal is inactive, indicating that the lane is not tested as the broken lane, and the Test_Enable1 signal is active, indicating that the test for read operation is being executed, the MUX2 92 provides the Test_Rise_Wr[n] signal and the Test_Fall_Wr[n] signal. On the other hand, the MUX2 92 provides the output signals of the DMUX 93 when either the Fault_lane[n] signal is active or the Test_Enable1 signal is inactive. The MUX2 92 provides either the output signals of the DMUX 93 or a combination of the Test_Rise_Wr[n] signal and the Test_Fall_Wr[n] signal to a serializer 97. The serializer 97 converts parallel signals from the MUX2 92 into a series of data responsive to the clock signal CK, and provide the series of data to the output buffer TX 95.

Figure 10:
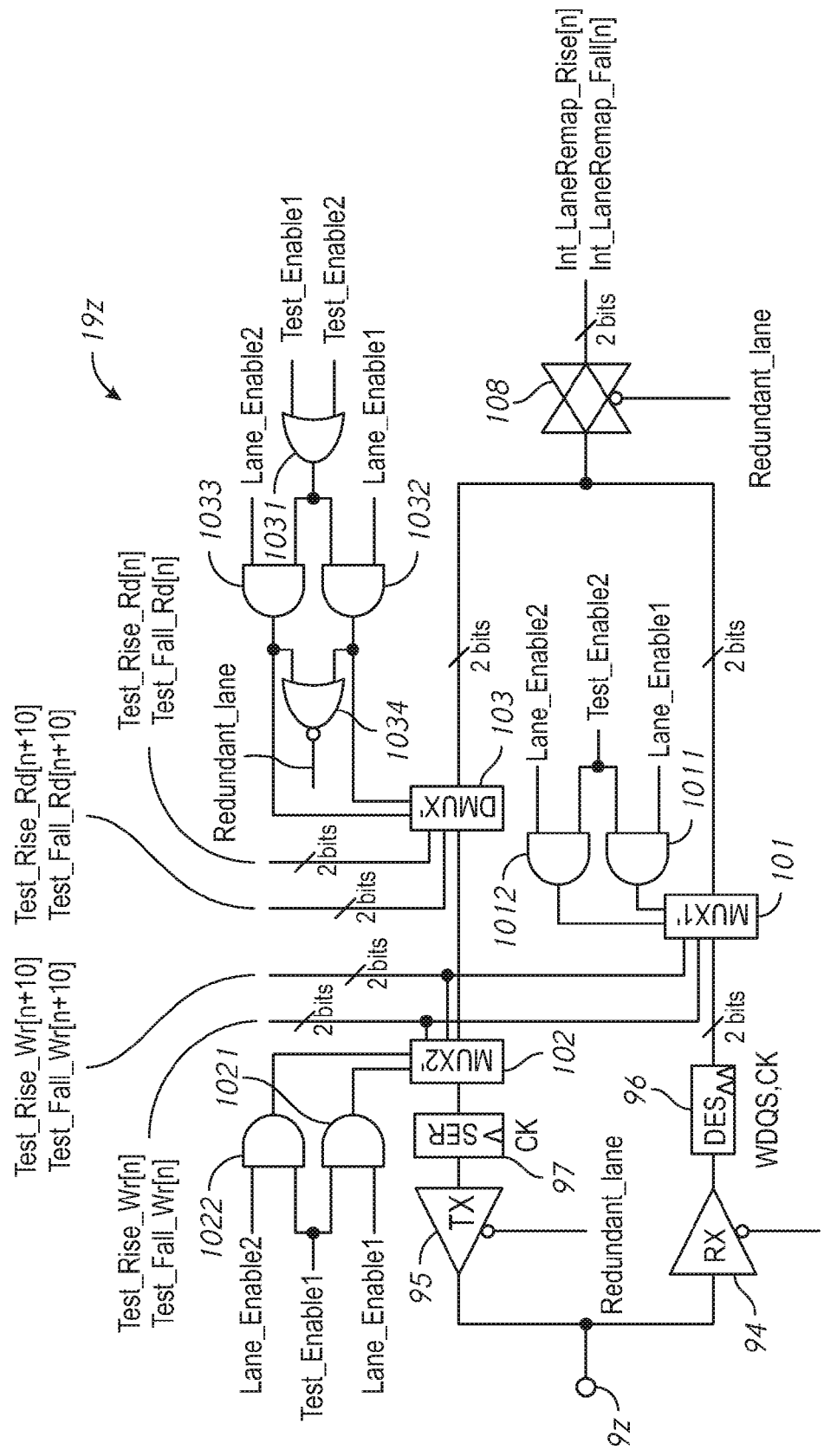
FIG. 10 is a circuit diagram of a circuit block for a redundancy lane, in accordance with an embodiment of the present disclosure.

FIG. 10 is a circuit diagram of a circuit block 19z for a redundancy lane, in accordance with an embodiment of the present disclosure. Description of components and signals corresponding to components and signals included in FIG. 9 will not be repeated. For example, the circuit block 19z may be used a circuit block 19k for a bump 9 to be coupled to an RD pin pins as well as signals from one of the test ports 160 (e.g., Test Port[n] or Test Port [n+10], where "n" is a natural number which may take a number 0 to 9), depending on the lane enable signals. In this circuit, two sets of two test signals may be combined into two lane remap test signals. For example, the circuit block 19z combines Test_Rise_Wr[n] signal and Test_Rise_Rd[n] signal into Int_LaneRemap_Rise[n] signal, responsive to the Lane_Enable1 signal. Alternatively, the circuit block 19z combines Test_Rise_Wr[n+10] signal and Test_Rise_Rd[n+10] signal into Int_LaneRemap_Rise[n] signal, responsive to the Lane_Enable2 signal. For example, the circuit block 19z combines Test_Fall_Wr[n] signal and Test_Fall_Rd[n] signal into Int_LaneRemap_Fall[n] signal, responsive to the Lane_Enable1 signal. Alternatively, the circuit block 19z combines Test_Fall_Wr[n+10] signal and Test_Fall_Rd[n+10] signal into Int_LaneRemap_Fall[n] signal, responsive to the Lane_Enable2 signal.

For example, in the test regarding the write operation, the circuit block 19z may receive an input signal from the bump 9z at an input buffer RX 94. The input buffer RX 94 may be activated responsive to an inactive signal of Redundant_lane signal from an NOR circuit 1034. The circuit block 19z may include a deserializer 96 that converts the data signal received at the input buffer RX 94 into parallel data signals responsive to a clock signal CK and a write data queue strobe signal and provides the parallel data signals to a multiplexer MUX1' 101. The MUX1' 101 receives the Test_Rise_Wr[n] signal, the Test_Fall_Wr[n] signal, the Test_Rise_Wr[n+10] signal and the Test_Fall_Wr[n+10] signal. The MUX1' 101 may have two select inputs. One select input of the MUX1' 101 receives an output signal of an AND circuit 1011 which receives the Test_Enable2 signal and the Lane_Enable1 signal. When the Lane_Enable1 signal and the Test_Enable2 signal are both active, indicating that the signals from Test Port[n] are subject to lane remapping for the write operation, the MUX1' 101 provides the Test_Rise_Wr[n] signal and the Test_Fall_Wr[n] signal. An other select input of the MUX1' 101 receives an output signal of an AND circuit 1012 which receives the Test_Enable2 signal and the Lane_Enable2 signal. When the Lane_Enable2 signal and the Test_Enable2 signal are both active, indicating that the signals from Test Port[n+10] are subject to lane remapping, the MUX1' 101 provides the Test_Rise_Wr[n+10] signal and the Test_Fall_Wr[n+10] signal. On the other hand, the MUX1' 101 provides the parallel data signals when either the Test_Enable2 signal is inactive or none of the lane enable signals is active. The MUX1' 101 provides either the parallel data signals, a combination of the Test_Rise_Wr[n] signal and the Test_Fall_Wr[n] signal or a combination of the Test_Rise_Wr[n+10] signal and the Test_Fall_Wr[n+10] signal to a transmission gate 108. The transmission gate 98 may be a bi-directional switch, which provides and receives the internal lane remapping signals Int_LaneRemap_Rise[n] signal and Int_LaneRemap_Fall[n], responsive to the inverted signal of the Redundant_lane signal from the NOR circuit 1034.

A demultiplexer DMUX' 103 provides input signals, either provided from the transmission gate 108 or provided from the MUX1' 101 as output signals. One select input of the DMUX' 103 receives an output signal of an AND circuit 1032 which receives the Lane_Enable1 signal and an output signal of an OR circuit 1031 which receives the Test_Enable1 and Test_Enable2 signals. When the Lane_Enable1 signal is active and either the Test_Enable1 signal or the Test_Enable2 signal is active, the DMUX 93 may provide the output signals as the Test_Rise_Rd[n] signal and the Test_Fall_Rd[n] signal. An other select input of the DMUX' 103 receives an output signal of an AND circuit 1033 which receives the Lane_Enable2 signal and the output signal of the OR circuit 1031. When the Lane_Enable2 signal is active and either the Test_Enable1 signal or the Test_Enable2 signal is active, the DMUX' 103 may provide the output signals as the Test_Rise_Rd[n+10] signal and the Test_Fall_Rd[n+10] signal. The DMUX' 103 may provide the output signals as input signals to a multiplexer MUX2' 102, when none of the lane enable signals is active or none of the test enable signals is active. The AND circuits 1032 and 1033 may be coupled to the NOR circuit 1034. The NOR circuit 1034 may provide Redundant_lane signal to the input buffer RX 94, the output buffer TX 95 and the transmission gate 108. Redundant_lane signal is an active-low signal responsive to an active-high output signal of the AND circuit 1032 or an active-high output signal of the AND circuit 1033.

The MUX2' 102 also receives the Test_Rise_Wr[n] signal, the Test_Fall_Wr[n] signal, the Test_Rise_Wr[n+10] signal and the Test_Fall_Wr[n+10] signal. The MUX2' 101 may have two select inputs. One select input of the MUX2' 102 receives an output signal of an AND circuit 1021 which receives the Test_Enable1 signal and the Lane_Enable1 signal. When the Lane_Enable1 signal and the Test_Enable1 signal are both active, indicating that the signals from Test Port[n] are subject to lane remapping for the read operation, the MUX2' 102 provides the Test_Rise_Wr[n] signal and the Test_Fall_Wr[n] signal. An other select input of the MUX2' 102 receives an output signal of an AND circuit 1022 which receives the Test_Enable1 signal and the Lane_Enable2 signal. When the Lane_Enable2 signal and the Test_Enable1 signal are both active, indicating that the signals from Test Port[n+10] are subject to lane remapping for the read operation, the MUX2' 102 provides the Test_Rise_Wr[n+10] signal and the Test_Fall_Wr[n+10] signal. On the other hand, the MUX2' 102 provides the output signals from the DMUX' 103 when either the Test_Enable1 signal is inactive or none of the lane enable signals is active. The MUX2' 102 provides either the output signals from the DMUX' 103, the combination of the Test_Rise_Wr[n] signal and the Test_Fall_Wr[n] signal or the combination of the Test_Rise_Wr [n+10] signal and the Test_Fall_Wr[n+10] signal to a serializer 97. The serializer 97 converts parallel signals from the MUX2 92 into a series of data responsive to the clock signal CK, and provide the series of data to the output buffer TX 95. The output buffer TX 95 may be activated responsive to the inactive signal of Redundant_lane signal from the NOR circuit 1034 and may further provide the series of data to the bump 9z.

Figure 11:
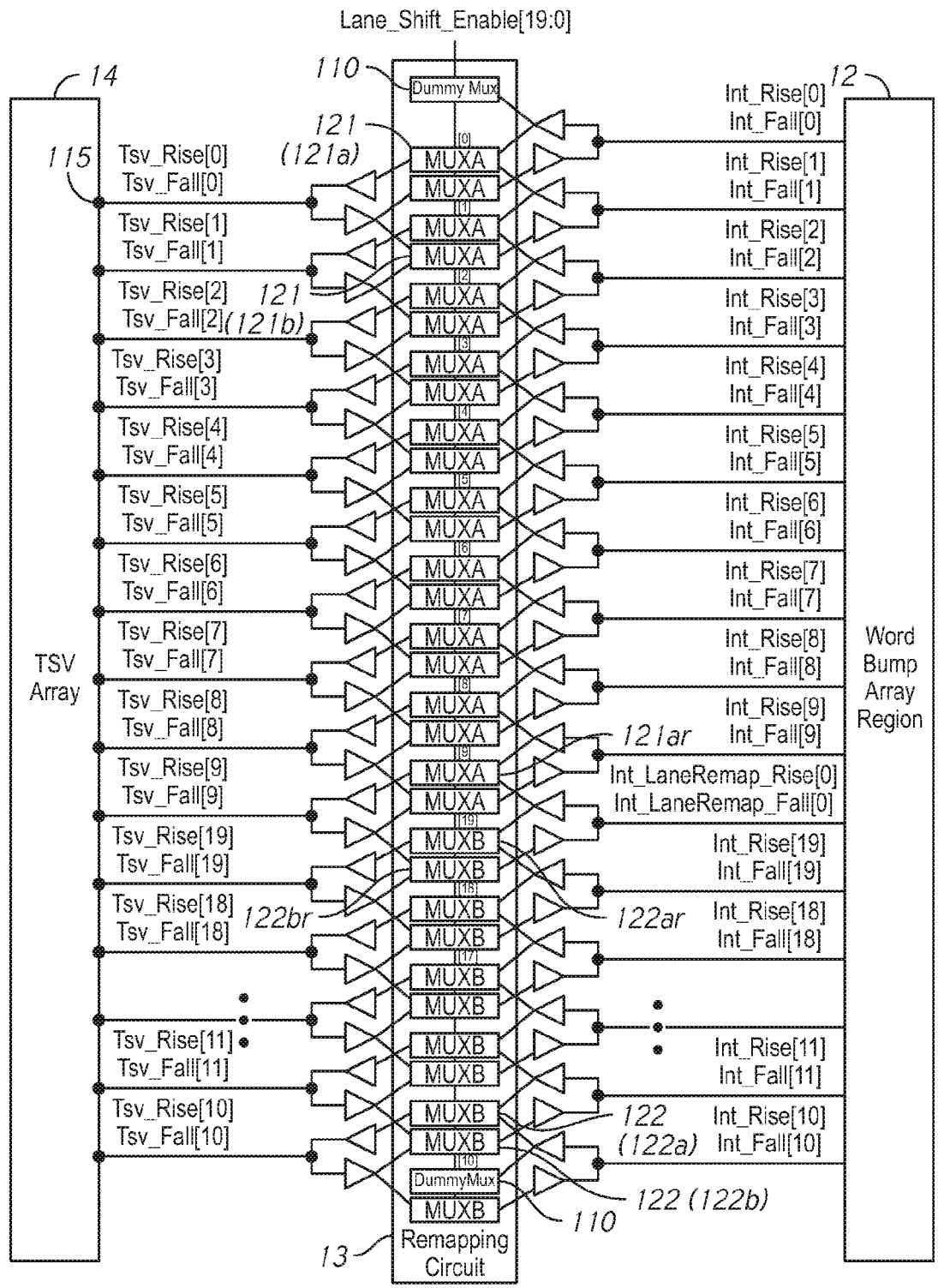
FIG. 11 is a block diagram of a remapping circuit, in accordance with an embodiment of the present disclosure.

FIG. 11 is a block diagram of a remapping circuit, in accordance with an embodiment of the present disclosure. For example, the remapping circuit 13 may include a plurality of multiplexers MUXA 121, a plurality of multiplexers MUXB 122, and a plurality of dummy multiplexers (Dummy Mux) 110. For example, the plurality of multiplexers MUXA 121 may be provided for lane remapping of signals related to Test Port[0:9] and the plurality of multiplexers MUXB 122 may be provided for lane remapping of signals related to Test Port[10:19]. For example, the dummy multiplexers 110 may receive one pair internal rise and fall signals instead of two pairs and equalize respective loads of driver circuits (not shown) for regulating signal transmissions. The plurality of multiplexers MUXA 121 and MUXB 122 be may couple a set of TSV terminals 115 in the TSV array sub region 14 of a particular word of a particular channel (e.g., "DWORD channel a") to a previously selected set of circuit blocks 19 by the control circuit 21 referring to FIG. 3. Each of the plurality of multiplexers MUXA 121 and MUXB 122 may be configured to couple to one or more circuit blocks 19 and further configured to selectively couple one of the one or more circuit blocks 19, responsive to a corresponding lane shift enable signals (e.g., Lane_Shift_Enable[19:0]) from the control circuit 21.

Figure 12A:
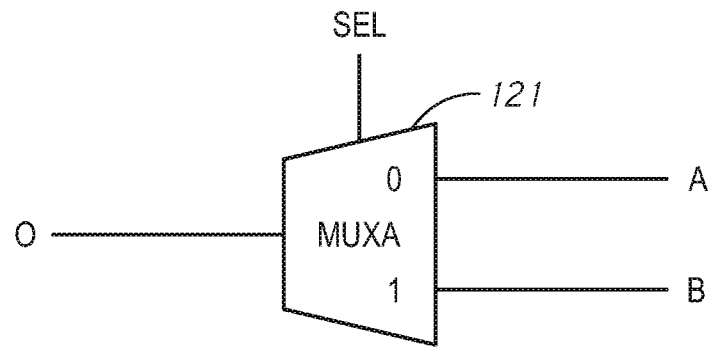
FIG. 12A is a schematic diagram of a multiplexer, in accordance with an embodiment of the present disclosure.

FIG. 12A is a schematic diagram of a multiplexer MUXA, in accordance with an embodiment of the present disclosure. For example, the multiplexer MUXA 121 may receive an input signal A at a node A and an input signal B at a node B and may provide either the input signal A or the input signal B as an output signal O at a node O responsive to a select signal SEL at a node SEL representing either "0" or "1". In the remapping circuit 13 of FIG. 11, the plurality of multiplexers MUXA 121 may be arranged in a manner that a plurality of multiplexers MUXA 121a receive an adjacent pairs of the internal signals Int_Rise[0:9] signals and Int_Fall [0:9] signals via buffers and provide Tsv_Rise[0:9] signals and Tsv_Fall [0:9] signals to the TSV array sub region 14 via buffers responsive to the Lane_Shift_Enable [0:9] signals. Furthermore, a plurality of multiplexers MUXA 121b receive an adjacent pairs of Tsv_Rise[0:9] signals and Tsv_Fall [0:9] signals from the TSV array sub region 14 via buffers and provide the internal signals Int_Rise[0:9] signals and Int_Fall [0:9] signals via buffers responsive to the Lane_Shift_Enable[0:9] signals. For example, a multiplexer MUXA 121a may receive two adjacent pairs of internal rise and fall signals (e.g., a pair of Int_Rise[0] signal and Int_Fall[0] signal and a pair of Int_Rise[1] signal and Int_Fall[1] signal) from the word bump array region 12 and may provide either one of the adjacent pairs as a pair of rise and fall signals to the TSV array sub region 14 (e.g., Tsv_Rise[0] signal and Tsv_Fall[0] signal), responsive to Lane_Shift_Enable[0] signal. For example, a multiplexer MUXA 121b may receive two adjacent pairs of rise and fall signals from the TSV array sub region 14 (e.g., the pair of Tsv_Rise[0] signal and Tsv_Fall [0] signal, and a pair of Tsv_Rise[1] signal and Tsv_Fall[1] signal) and may provide either one of the adjacent pairs as a pair of internal rise and fall signals (e.g., the pair of Int_Rise[1] signal and Int_Fall[1] signal) responsive to Lane_Shift_Enable[1] signal.

Figure 12B:
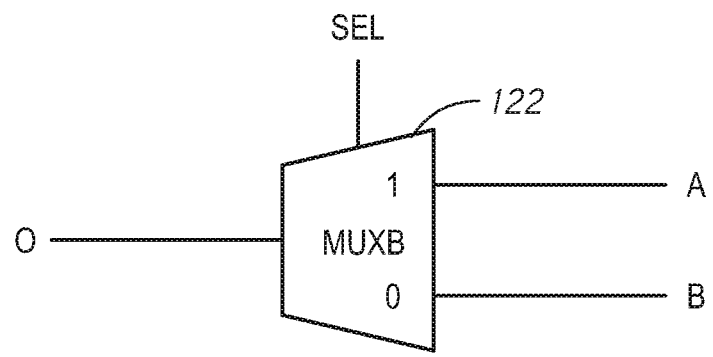
FIG. 12B is a schematic diagram of a multiplexer, in accordance with an embodiment of the present disclosure.

FIG. 12B is a schematic diagram of a multiplexer MUXB, in accordance with an embodiment of the present disclosure. For example, the multiplexer MUXB 122 may receive an input signal A at a node A and an input signal B at a node B and may provide either the input signal A or the input signal B as an output signal O at a node O responsive to a select signal SEL at a node SEL representing either "1" or "0". In the remapping circuit 13 in FIG. 11, the plurality of multiplexers MUXB 122 may be arranged in a manner that plurality of multiplexers MUXB 122a receive an adjacent pairs of the internal signals Int_Rise[10:19] signals and Int_Fall [10:19] signals and provide Tsv_Rise[10:19] signals and Tsv_Fall [10:19] signals responsive to the Lane_Shift_Enable[10:19] signals. Furthermore, a plurality of multiplexers MUXB 122b receive an adjacent pairs of Tsv_Rise[10:19] signals and Tsv_Fall [10:19] signals from the TSV array sub region 14 and provide the internal signals Int_Rise[10:19] signals and Int_Fall [10:19] signals responsive to the Lane_Shift_Enable[10:19] signals received as the SEL signal. For example, a multiplexer MUXB 122a may receive two adjacent pairs of internal rise and fall signals (e.g., a pair of Int_Rise[10] signal and Int_Fall[10] signal and a pair of Int_Rise[11] signal and Int_Fall[11] signal)

from the word bump array region 12 and may provide either one of the adjacent pairs as a pair of rise and fall signals to the TSV array sub region 14 (e.g., Tsv_Rise[10] signal and Tsv_Fall[10] signal), responsive to Lane_Shift_Enable[10] signal. For example, a multiplexer MUXB 122b may receive two adjacent pairs of rise and fall signals from the TSV array sub region 14 (e.g., the pair of Tsv_Rise[10] signal and Tsv_Fall[10] signal, and a pair of Tsv_Rise[11] signal and Tsv_Fall[11] signal) and may provide either one of the adjacent pairs as a pair of internal rise and fall signals (e.g., the pair of Int_Rise[11] signal and Int_Fall[11] signal) responsive to Lane_Shift_Enable[11] signal.

The remapping circuit 13 may include a multiplexer MUXA 121ar and multiplexers MUXB 122ar and 122br. The multiplexer MUXA 121ar may receive an adjacent pair of internal rise and fall signals (e.g., a pair of Int_Rise[9] signal and Int_Fall[9] signal) and internal lane remapping rise and fall signals (e.g., a pair of Int_LaneRemap_Rise[0] signal and Int_LaneRemap_Fall[0] signal) from the circuit blocks of the word bump array region 12 and may provide either one of the adjacent pairs as a pair of rise and fall signals to TSV terminals 115 (e.g., Tsv_Rise[9] signal and Tsv_Fall[9] signal), responsive to Lane_Shift_Enable[9] signal. For example, the TSV terminals 115 may be the plurality of pads 611 in FIG. 1B. The multiplexer MUXB 122ar may receive an adjacent pair of internal rise and fall signals (e.g., a pair of Int_Rise[19] signal and Int_Fall[19] signal) and internal lane remapping rise and fall signals (e.g., the pair of Int_LaneRemap_Rise[0] signal and Int_LaneRemap_Fall[0] signal) from the word bump array region 12 and may provide either one of the adjacent pairs as a pair of rise and fall signals to TSV terminals 115 (e.g., Tsv_Rise[19] signal and Tsv_Fall[19] signal), responsive to Lane_Shift_Enable[19] signal. The multiplexer MUXB 122br may receive two adjacent pairs of rise and fall signals from the TSV terminals 115 (e.g., the pair of Tsv_Rise[9] signal and Tsv_Fall[9] signal, and a pair of Tsv_Rise[19] signal and Tsv_Fall[19] signal) and may provide either one of the adjacent pairs as the pair of internal lane remapping rise and fall signals (e.g., the pair of Int_LaneRemap_Rise[0] signal and Int_LaneRemap_Fall[0] signal) responsive to Lane_Shift_Enable[19] signal. Thus, appropriate pair of signals out of the adjacent pair of either internal signals or TSV signals may be provided to TSV terminals 115 or to the word bump array region 12, depending on a lane shift operation involving either the bump array unit 41a for Byte0 or the bump array unit 41b for Byte1. Here, the number of the TSV terminals 115 is smaller than the number of internal signals corresponding to the number of circuit blocks coupled to the remapping circuit 13 by a number of terminals associated to the internal lane remapping rise and fall signals.

Figure 13A:
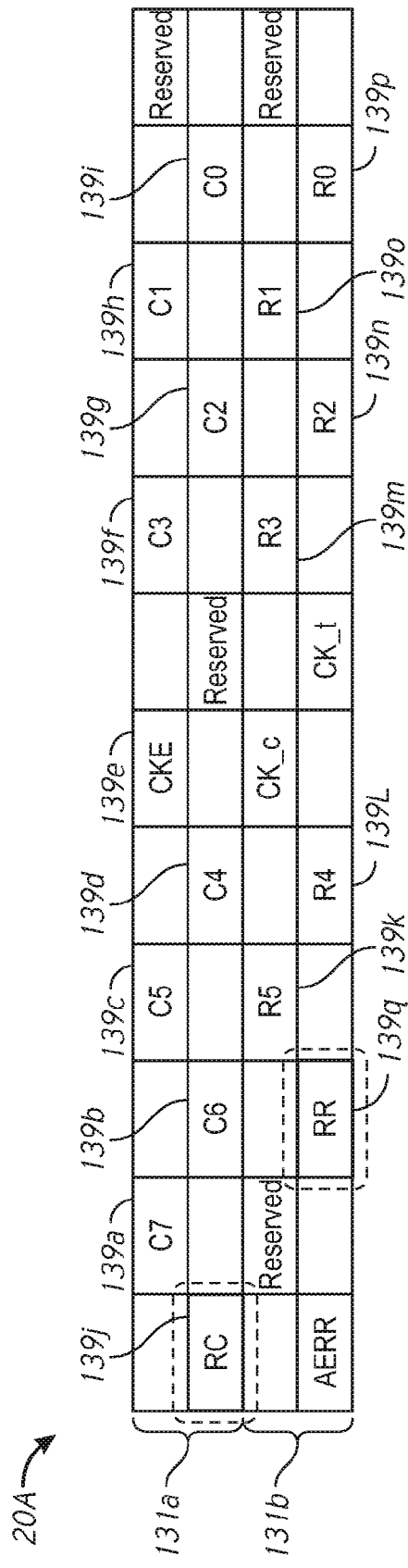
FIG. 13A is a schematic diagram of an original lane assignment in a circuit group for an address word, in accordance with an embodiment of the present disclosure.

FIG. 13A is a schematic diagram of an original lane assignment in a circuit group for an address word, in accordance with an embodiment of the present disclosure. For example, the circuit group may be a AWORD circuit group 20A including a bump array units for corresponding two bytes per word, such as a bump array unit 131a for Byte0 and a bump array unit 131b for Byte1. For example, FIG. 13A shows assignments of corresponding bumps 9 to the set of bump array units per one word that may be the AWORD circuit group 20A. Each bump array unit of the bump array units 131a to 131b may include ten circuit blocks 139 to be coupled to ten corresponding bumps 9 in one test operation for testing the AWORD circuit group 20A.

For example, the bump array unit 131a for Byte0 may include circuit blocks 139a, 139b, 139c, 139d, 139f, 139g, 139h, 139i and 139e, which may correspond to bumps 9 for providing signals from column command pins C7, C6, C5, C4, C3, C2, C1, C0 and a clock enable pin CKE. The circuit block 139j corresponds to a redundancy lane RC for column command bits. The bump array unit 131a also includes circuit blocks (reserved) for future use. The bump array unit 41b for Byte1 may include circuit blocks 139k, 139l, 139m, 139n, 139o and 139p which may correspond to bumps 9 for providing signals from row command pins R5, R4, R3, R2, R1 and R0. The circuit block 139q corresponds to a redundancy lane RR for row command bits. The bump array unit 131a also includes circuit blocks correspond to clock signals pins CK_c and CK_t and an address parity error pin AERR. Row command signals, column command signals and CKE signal are allowed to remap one lane for each bus. CK_c, CK_t, AERR signals cannot be remapped.

For example, a redundancy lane RC at the circuit block 139j may be provided for a column command, and a redundancy lane RR at the circuit block 139q may be provided for a row command. The lane remapping function may use circuit blocks 139 related to column command signals C0 to C7 and row command signals R0 to R5 and clock enable signal CKE. For example, the AWORD circuit group 20A in FIG. 13A may use column command signals C0 to C7 and row command signals R0 to R5 and clock enable signal CKE. FIG. 14A is a lane mapping table of the original lane assignment of FIG. 13A, in accordance with an embodiment of the present disclosure. For example, the lane mapping table shows a relationship between internal functions, bumps, test ports and circuit blocks for the AWORD circuit group 20A in FIG. 13A.

FIG. 13B is a schematic diagram of a remapped lane assignment for column command signals in a circuit group for an address word, in accordance with an embodiment of the present disclosure. FIG. 14B is a lane mapping table of the remapped lane assignment of FIG. 13B, in accordance with an embodiment of the present disclosure. For example, the lane mapping table shows a relationship between internal functions, bumps, test ports and circuit blocks for the AWORD circuit group 20A in FIG. 13B. For example, a bump 9 corresponding to a circuit block 139i may be assigned as a broken lane for testing possible lane remapping variations. For example, the circuit blocks 139j and 139a to 139h in the remapped lane assignment indicated by bold squares in FIG. 13B may be used for the column command signals C7 to C0 and the CKE signal, after lane remapping. The circuit block 139j provided for the bump 9 for the redundancy lane RC in FIG. 13A may be used for the column command signal C7 in FIG. 13B.

FIG. 13C is a schematic diagram of a remapped lane assignment for row command signals in a circuit group for an address word, in accordance with an embodiment of the present disclosure. FIG. 14C is a lane mapping table of the remapped lane assignment of FIG. 13C, in accordance with an embodiment of the present disclosure. For example, the lane mapping table shows a relationship between internal functions, bumps, test ports and circuit blocks for the AWORD circuit group 20A in FIG. 13C. For example, a bump 9 corresponding to a circuit block 139p may be assigned as a broken lane for testing possible lane remapping variations. For example, the circuit blocks 139q and 139k to 139o in the remapped lane assignment indicated by bold squares in FIG. 13C may be used for the row command signals R5 to R0, after lane remapping. The circuit block 139q provided for the bump 9 for the redundancy lane RR in FIG. 13A may be used for the row command signal R5 in FIG. 13C.

After a lane is remapped, the circuit block associated with the broken lane may be turned off and the circuit block associated with the redundant pin (RD, RR or RC) may be turned on. Thus, functionalities are preserved with data, row or column command lane remapping.

Logic levels of signals used in the embodiments described the above are merely examples. However, in other embodiments, combinations of the logic levels of signals other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising
    a first chip, the first chip comprising, on a single semiconductor substrate:
        a set of first terminals;
        a plurality of circuit groups, each of the plurality of circuit groups including a set of circuit blocks being configured to electrically couple to the set of first terminals;
        a control circuit configured to select a selected one of the plurality of circuit groups and electrically couple the set of first terminals to the set of circuit blocks of the one of the plurality of circuit groups;
        a plurality of terminal groups, each of the plurality of terminal groups including a set of second terminals, each of the plurality of terminal groups being provided correspondingly to each of the plurality of circuit groups, the set of second terminals of each of the plurality of terminal groups including fewer second terminals than circuits blocks included in the set of circuit blocks of a corresponding one of the plurality of circuit groups; and
        a remapping circuit configured to couple the set of second terminals of each of the plurality of terminal groups to selected ones of the set of circuit blocks of the corresponding one of the plurality of circuit groups.

2. The apparatus of claim 1, wherein a number of first terminals of the set of first terminals is smaller than a number of circuit blocks in the set of circuit blocks of each of the plurality of circuit groups, the control circuit being configured to electrically couple at least one of the set of first terminals in common to at least two of the set of circuit blocks of the selected one of the plurality of circuit groups and electrically couple remaining one or ones of the set of first terminals to remaining one or ones of the set of circuit blocks of the selected one of the plurality of circuit groups.

3. The apparatus of claim 1, wherein each first terminal of the set of first terminals is exposed on an external side of the first chip and each circuit block of the set of circuit blocks of each of the plurality of circuit groups includes a third terminal exposed on the external side of the first chip.

4. The apparatus of claim 1, wherein the first chip further comprises:
    a substrate; and
    a plurality of additional terminal groups, each of the plurality of additional terminal groups including a set of through substrate electrodes each penetrating the substrate, the set of through substrate electrodes of each of the plurality of additional terminal groups being coupled to the set of second terminals of a corresponding one of the plurality of terminal groups.

5. The apparatus of claim 3, wherein the third terminal of each of the plurality of circuit blocks of each of the circuit groups is configured to selectively couple to one of a bump or to each first terminal of the plurality of first terminals.

6. The apparatus of claim 1, further comprising a main substrate on which the first chip is stacked and a controller chip stacked on the main substrate, the controller chip being configured to control each of the plurality of circuit groups.

7. An apparatus comprising an interface chip, the interface chip comprising:
    a direct access test port circuit comprising a set of test ports configured to receive a set of test control signals, the direct access test port circuit being configured to provide a set of groups of first test signals, each group of first test signals in the set of groups of first test signals being based on a corresponding test control signal of the set of test control signals;
    a control circuit configured to provide the set of groups of first test signals from the set of test ports;
    a plurality of circuit blocks including a set of first circuit blocks corresponding to a first byte and further including a set of second circuit blocks corresponding to a second byte, each circuit block being configured to receive one group of the set of groups of first test signals from the control circuit, each circuit block being further configured to receive an input signal from an interconnect, and each circuit block being further configured to provide internal signals based on either the one group of first test signals or the input signal;
    a plurality of TSV terminals coupled to a plurality of conductive vias; and
    a remapping circuit configured to couple the plurality of circuit blocks to the corresponding plurality of TSV terminals, the remapping circuit includes a plurality of multiplexers, each of the plurality of multiplexers is configured to couple to one or more circuit blocks, the plurality of multiplexers including a set of first multiplexers, each first multiplexer configured to couple to one or more corresponding first circuit blocks of the set of first circuit blocks and further including a set of second multiplexers, each second multiplexer being configured to couple to one or more corresponding second circuit blocks of the set of second circuit blocks,
    wherein a number of TSV terminals included in the plurality of TSV terminals is smaller than a number of circuit blocks included in the plurality of circuit blocks.

8. The apparatus of claim 7, wherein each circuit block is further configured to provide the internal signals based on the one group of first test signals responsive to a test enable signal indicative of a test regarding a write operation.

9. The apparatus of claim 7, wherein each of the plurality of multiplexers is configured to selectively couple one of the one or more circuit blocks, responsive to a corresponding lane shift enable signal from the control circuit.

10. The apparatus of claim 7, wherein the set of second multiplexers comprises one second multiplexer comprising a first input coupled to one first circuit block of the set of first circuit blocks and a second input coupled to one second circuit block of the set of second circuit blocks, and
wherein the one first circuit block of the set of first circuit blocks is a redundancy circuit block which is used when the plurality of circuit blocks comprises an inactive circuit block.

11. The apparatus of claim 10, wherein the inactive circuit block becomes inactive responsive to an active fault lane signal from the control circuit.

12. The apparatus of claim 10, wherein the redundancy circuit block is configured to receive at least one lane enable signal, a first group of first test signals corresponding to the first byte and a second group of first test signals corresponding to the second byte from one of the set of second circuit blocks from the control circuit, and further configured to provide the internal signals based on either the first group of first test signals or the second group of first test signals to the one second multiplexer responsive to the at least one lane enable signal.

13. An apparatus comprising an interface chip, the interface chip comprising:
a direct access test port circuit comprising a set of test ports configured to receive a set of test control signals, the direct access test port circuit being configured to provide a set of groups of first test signals, each group of first test signals in the set of groups of first test signals being based on a corresponding test control signal of the set of test control signals;
a control circuit configured to provide the set of groups of first test signals from the set of test ports;
a plurality of circuit blocks, each circuit block being configured to receive one group of the set of groups of first test signals from the control circuit, each circuit block being further configured to receive an input signal from an interconnect, and each circuit block being further configured to provide internal signals based on either the one group of first test signals or the input signal;
a plurality of TSV terminals coupled to a plurality of conductive vias; and
a remapping circuit configured to couple the plurality of circuit blocks to the corresponding plurality of TSV terminals,
wherein the plurality of TSV terminals is smaller in number than the plurality of circuit blocks,
wherein the plurality of circuit blocks comprises a set of first circuit blocks corresponding to a first byte and a set of second circuit blocks corresponding to a second byte,
wherein the remapping circuit comprises a plurality of multiplexers, each of the plurality of multiplexer is configured to couple to one or more TSV terminals, and
wherein the plurality of multiplexers comprises:
a set of first multiplexers, each first multiplexer being configured to couple to one or more first TSV terminals among the plurality of TSV terminals to a corresponding first circuit block of the set of first circuit blocks; and
a set of second multiplexers, each second multiplexer being configured to couple to one or more second TSV terminals among the plurality of TSV terminals to a corresponding second circuit block of the set of second circuit blocks.

14. A method of providing test signals on an interface chip, the method comprising:
receiving a set of test control signals;
providing a set of groups of first test signals, each group of first test signals in the set of groups of first test signals being based on a corresponding test control signal of the set of test control signals;
receiving one group of first test signals among the set of groups of first test signals and an input signal from an interconnect at one circuit block among a plurality of circuit blocks;
providing internal signals from the one circuit block, based on either the one group of first test signals or the input signal; and
selectively coupling the one circuit block to a corresponding one TSV terminal of a plurality of TSV terminals coupled to a corresponding conductive via by a remapping circuit responsive to a corresponding lane shift enable signal,
wherein a number of TSV terminals included in the plurality of TSV terminals is smaller than a number of circuit blocks included in the plurality of circuit blocks.

15. The method of claim 14, wherein the remapping circuit comprises a plurality of multiplexers configured to couple to one or more circuit blocks, and
wherein selectively coupling the one circuit block to the corresponding one TSV terminal of the plurality of TSV terminals comprises selectively coupling one of the one or more circuit blocks to the corresponding one TSV terminal by each of the plurality of multiplexers, responsive to the corresponding lane shift enable signal.

16. The method of claim 15, wherein the plurality of circuit blocks comprises a set of first circuit blocks corresponding to a first byte and a set of second circuit blocks corresponding to a second byte, and
wherein the plurality of multiplexers comprises:
a set of first multiplexers, each first multiplexer being configured to couple to one or more corresponding first circuit blocks of the set of first circuit blocks, and
a set of second multiplexers, each second multiplexer being configured to couple to one or more corresponding second circuit blocks of the set of second circuit blocks.

17. The method of claim 16, wherein the set of second multiplexers comprises one second multiplexer comprising a first input coupled to one first circuit block of the set of first circuit blocks and a second input coupled to one second circuit block of the set of second circuit blocks,
wherein the one first circuit block of the set of first circuit blocks is a redundancy circuit block which is used when the plurality of circuit blocks comprises an inactive circuit block,
wherein receiving the one group of first test signals among the set of groups of first test signals and the input signal at the one circuit block among the plurality of circuit blocks comprises: receiving at least one lane enable signal, a first group of first test signals corresponding to the first byte and a second group of first test signals corresponding to the second byte from one of the set of second circuit blocks by the redundancy circuit block, and wherein providing the internal signals from the one circuit block, based on either the one group of first test signals or the input signal comprises: providing the internal signals based on either the first group of first test signals or the second group of first test signals to the one second multiplexer responsive to the at least one lane enable signal.

18. The method of claim 14, wherein the remapping circuit comprises a plurality of multiplexers configured to couple to one or more TSV terminals, and
wherein coupling the one circuit block to the corresponding one TSV terminal of the plurality of TSV terminals comprises selectively coupling one of the one or more TSV terminals to the one circuit block by each of the plurality of multiplexers, responsive to a corresponding lane shift enable signal.

* * * * *